US010680643B2

(12) United States Patent
Cassetti et al.

(10) Patent No.: US 10,680,643 B2
(45) Date of Patent: Jun. 9, 2020

(54) COMPRESSION SCHEME WITH CONTROL OF SEARCH AGENT ACTIVITY

(71) Applicant: Intel Corporation, Santa Clara, CA (US)

(72) Inventors: David K. Cassetti, Tempe, AZ (US); Stephen T. Palermo, Chandler, AZ (US); Sailesh Bissessur, Phoenix, AZ (US); Patrick Fleming, Slatt Wolfhill (IE); Lokpraveen Mosur, Gilbert, AZ (US); Smita Kumar, Chandler, AZ (US); Pradnyesh S. Gudadhe, Chandler, AZ (US); Naveen Lakkakula, Chandler, AZ (US); Brian Will, Phoenix, AZ (US); Atul Kwatra, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/297,579

(22) Filed: Mar. 8, 2019

(65) Prior Publication Data
US 2019/0273507 A1    Sep. 5, 2019

Related U.S. Application Data

(60) Provisional application No. 62/779,954, filed on Dec. 14, 2018, provisional application No. 62/779,950, filed on Dec. 14, 2018.

(51) Int. Cl.
*H03M 7/38* (2006.01)
*H03M 7/30* (2006.01)
(Continued)

(52) U.S. Cl.
CPC ........ *H03M 7/3086* (2013.01); *G06F 40/126* (2020.01); *G06F 40/149* (2020.01);
(Continued)

(58) Field of Classification Search
CPC ............ H03M 7/00; H03M 5/00; H03M 7/40; H03M 7/3079
USPC .......................... 341/51, 50, 67, 87, 65, 107
See application file for complete search history.

(56) References Cited

U.S. PATENT DOCUMENTS

| 8,248,279 B2 * | 8/2012 | Buckingham ....... H03M 7/3084 341/50 |
| 10,187,081 B1 | 1/2019 | Diamant et al. |

(Continued)

OTHER PUBLICATIONS

P. Deutsch, "Deflate Compressed Data Format Specification version 1.3", Network Working Group, Aladdin Enterprises, May 1996, 12 pages.

(Continued)

*Primary Examiner* — Joseph J Lauture
(74) *Attorney, Agent, or Firm* — Compass IP Law PC

(57) ABSTRACT

In connection with compression of an input stream, multiple portions of the input stream are searched against previously received portions of the input stream to find any matches of character strings in the previously received portions of the input stream. In some cases, matches of longer character strings, as opposed to shorter character strings, can be selected for inclusion in an encoded stream that is to be compressed. Delayed selection can occur whereby among multiple matches, a match that is longer can be selected for inclusion in the encoded stream and non-selected a character string match is reverted to a literal. A search engine that is searching an input stream to identify a repeat pattern of characters can cease to search for characters that were included in the selected character string match.

23 Claims, 15 Drawing Sheets

(51) Int. Cl.
*H03M 7/40* (2006.01)
*G06F 40/126* (2020.01)
*G06F 40/149* (2020.01)
*G06F 40/157* (2020.01)
*G06F 40/284* (2020.01)
*H03M 7/00* (2006.01)
*H03M 5/00* (2006.01)

(52) U.S. Cl.
CPC .......... *G06F 40/157* (2020.01); *G06F 40/284* (2020.01); *H03M 7/3088* (2013.01); *H03M 7/40* (2013.01); *H03M 7/6023* (2013.01); *H03M 7/6029* (2013.01); *H03M 5/00* (2013.01); *H03M 7/00* (2013.01); *H03M 7/3079* (2013.01)

(56) References Cited

U.S. PATENT DOCUMENTS

| | | |
|---|---|---|
| 10,224,957 B1 | 3/2019 | Cassetti et al. |
| 2019/0123763 A1 | 4/2019 | Bissessur et al. |
| 2019/0207624 A1 | 7/2019 | Cassetti et al. |

OTHER PUBLICATIONS

Suman M. Choudary, et al., "Study of LZ77 and LZ78 Data Compression Techniques", International Journal of Engineering Science and Innovative Technology (IJESIT) vol. 4, Issue 3, May 2015, 5 pages.

First Office Action for U.S. Appl. No. 16/297,577, dated Jan. 7, 2020, 8 pages.

\* cited by examiner

| File SIZE | File TYPE | Percentage of Search MATCH Length (Match Len) Lengths | | | | Percentage of Search Distance (Dis) OFFSET Lengths | | | | Percentage of Search Literal Length (Lit Len) | | | | Standard Deviation of Match Len Freq Counts | Standard Deviation of Dis Freq Counts | Standard Deviation of Lit Len Freq Counts | SELECTED Compression Algorithm |
|---|---|---|---|---|---|---|---|---|---|---|---|---|---|---|---|---|---|
| | | [0-7] | [8-15] | [16-63] | [64+] | [0-7] | [8-15] | [16-63] | [64+] | [0-7] | [8-15] | [16-63] | [64+] | | | | |
| >1KB | TEXT | >60% | * | * | <5% | * | * | * | <10% | <40% | >20% | * | * | <10% | * | <15% | ZSTD |
| >1KB | IMAGE | * | * | >15% | * | >30% | * | * | <10% | * | * | * | * | * | <8% | >50% | DEFLATE Dynamic |
| <1KB | IMAGE | * | * | >15% | * | >30% | * | * | <10% | * | * | * | * | * | * | * | DEFLATE Static |

FIG. 2

```
                    1111111111222222222233333333
          0123456789012345678901234567890123456789   | Stream position
          Light eaters rather like heated theaters   | Input bytes
          11111111111111111111143111135654311         | Match length at each position
                                22    102222         
                                00    788888         | Match offset at each position
                    1111111111222222222233333333
          0123456789012345678901234567890123456000012555000    | Retirement pointer (without eDMM)
                                    4    3 5        | Token length (without eDMM)
                                    2    1 2        
                                    0    7 8        | Token offset (without eDMM)
Light eaters rather like h<4,20>d <3,17><5,28>      | Output literals / tokens (without eDMM)

1111111111222222222233333333
          0123456789012345678901234567890123456789   | Stream position
          Light eaters rather like heated theaters   | Input bytes
          11111111111111111111143111135654311         | Match length at each position
                                22    102222         
                                00    788888         | Match offset at each position
                    1111111111222222222233333333
          0123456789012345678901234567890123456000012340000    | Retirement pointer (with eDMM)
                                    4    6          | Token length (with eDMM)
                                    2    2          
                                    0    8          | Token offset (with eDMM)
Light eaters rather like h<4,20>d th<6,28>          | Output literals / tokens (with eDMM)
```

FIG. 3

COMPRESSION SCHEME WITH CONTROL OF SEARCH AGENT ACTIVITY

RELATED APPLICATION

The present application claims the benefit of priority date of U.S. provisional patent application Ser. No. 62/779,950, filed Dec. 14, 2018, the entire disclosure of which is incorporated herein by reference.

The present application claims the benefit of priority date of U.S. provisional patent application Ser. No. 62/779,954, filed Dec. 14, 2018, the entire disclosure of which is incorporated herein by reference.

The present application is related to "DATA COMPRESSION ENGINE FOR DICTIONARY BASED LOSSLESS DATA COMPRESSION," Ser. No. 16/228,300, filed Dec. 20, 2018.

TECHNICAL FIELD

Various examples described herein relate to techniques for encoding or compressing bit strings or characters.

BACKGROUND

Data can be compressed using a lossless or lossy compression algorithm to reduce the amount of data required to store or transmit digital content. Lossless compression algorithms reconstruct the original message exactly from the compressed representation. By contrast, lossy compression algorithms can reconstruct the original message but with lost data or reduced quality. Lossless data compression algorithms include Lempel-Ziv (LZ) algorithms such as LZ77 and LZ4. Applications that perform file compression and decompression and that can use LZ lossless data compression algorithms include GNU zip (gzip), GIF (Graphics Exchange Format) and Zstandard.

A dictionary coder is a class of lossless data compression algorithms that operates by searching for a match between text in the message to be compressed and a set of strings in a "dictionary" maintained by an encoder. When the encoder finds a match for a string in the message, it substitutes the string with a reference to the string's position in the dictionary.

BRIEF DESCRIPTION OF THE DRAWINGS

FIG. 2 depicts an example table that illustrates a scheme that can be used to select a compression scheme in accordance with an embodiment.

FIG. 3 depicts examples of input stream representations in accordance with an embodiment in accordance with an embodiment.

DETAILED DESCRIPTION

Figure 1:
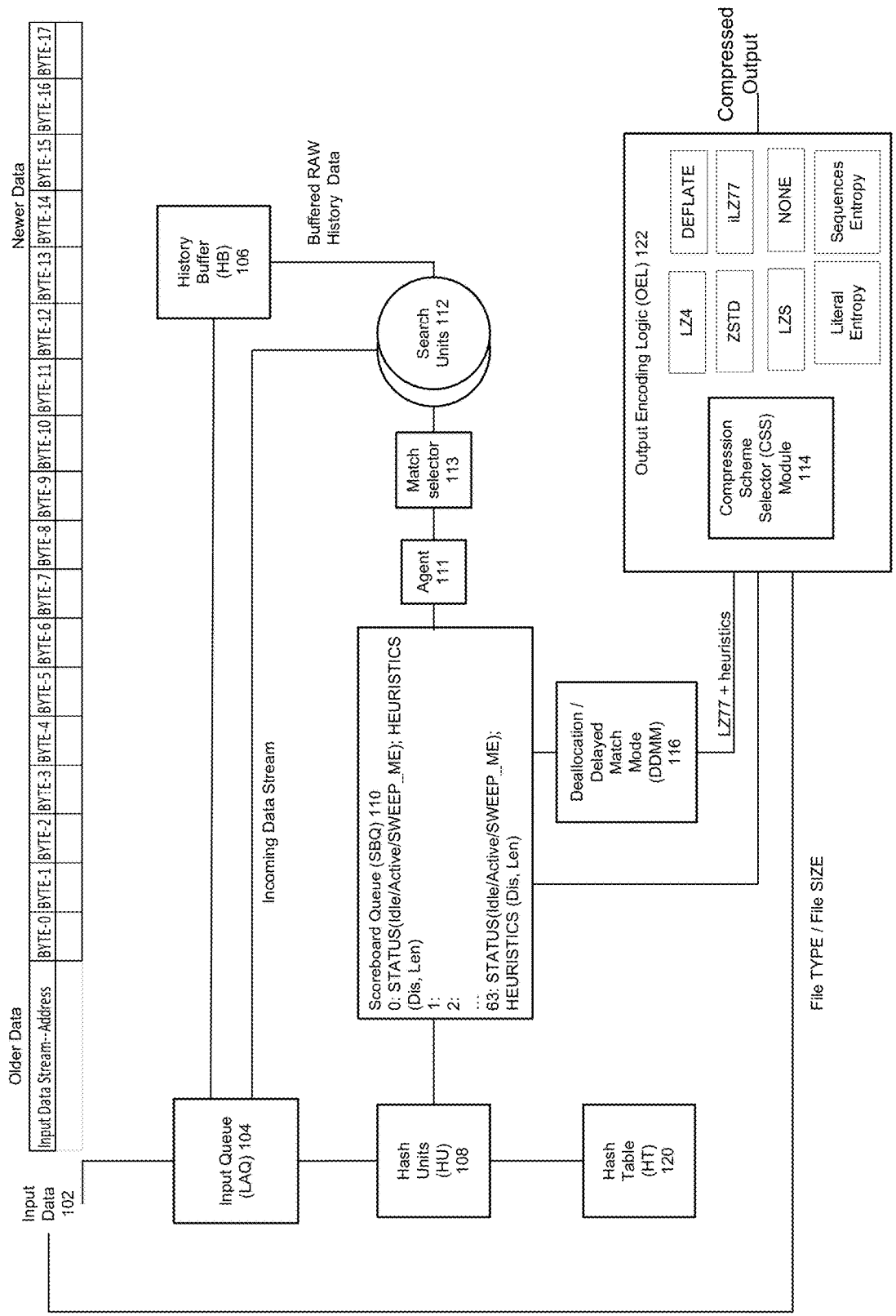
FIG. 1 depicts a block diagram of a compression engine in accordance with an embodiment.

An encoder that uses an LZ lossless data compression algorithm to compress an input stream data uses prior input data information of the input data stream that can be referred to as "history." The LZ lossless data compression algorithm searches the history for a string that matches a later portion of the input data stream. If such a match is found, the encoder encodes the matched later portion of the input data using a reference (offset and length) to the matching string in the history. Otherwise, the encoder encodes a next character of the input data stream as a raw data code or a "literal" that designates the character as plain text or clear text. The just encoded portion of the input data stream is then added to the history and is included in the search to match the next portion of the input data stream. The history can be stored in a fixed size, sliding window type buffer, from which the oldest data exits as new data from the input data stream is added.

The LZ algorithms dynamically build a dictionary while uncompressed data is received, and compressed data is transmitted. In some cases, no additional data is transmitted with the compressed data to allow the compressed data to be decompressed. The dictionary is dynamically rebuilt while the compressed data is decompressed. The LZ algorithms support compression at least of text, images, and videos.

Accordingly, with an encoder that uses an LZ lossless data compression algorithm, an input data stream is encoded with respect to preceding data in that same input data stream. The encoder that uses an LZ lossless data compression algorithm can achieve compression of the input data stream because the reference (offset and length) to the matching string can be much smaller than a portion of the input data stream that the reference represents.

Common metrics used to indicate the effectiveness and efficiency of a particular algorithm include compression ratio (e.g., a measure of compressed file size compared to original file size) and compression/decompression throughput (e.g., the time it takes to compress the original data files and the time taken to decompress the compressed files). Data compression performance depends primarily on the type of data (e.g., text, image, or media) and algorithm used. Different algorithms produce different compression ratios and throughputs for different types of data forms. Furthermore, different customer applications may want to optimize different aspects of the compression/decompression process. For example, cloud service providers may want to optimize compression throughput for image file uploads and forgo optimum compression ratios. Terrestrial-based Communication Service Provider customers may want to optimize compression ratio, possibly at the expense of throughput, to minimize the amount of network bandwidth is used to transfer digital data. Low Earth Satellite network providers may want to optimize throughput time to mitigate inherent earth to satellite latencies.

Various embodiments provide a manner of determining which input characters, bytes or literals to skip over after a token match has been identified. One or more search engines that are searching an input stream to identify repeat patterns of characters or bytes can cease to search characters that were included in the selected token. In some embodiments, the system can selectively halt search units from searching for a character string match in an input data stream in response to the character string being part of a character string for which a token has been chosen. For example, if a search unit is performing a search for matches of multiple characters that begin at position 1 and includes positions 2 and 3 but a token has been created for characters at positions 0-2, then the search unit can halt its search. The search unit can be allocated to search for characters beginning at a position other than position 1, such as position 3, for example. The search unit can be powered down or placed in a sleep state to conserve power. Accordingly, the one or more search engines can be freed to search other portions of the input characters or bytes before or after the token. Determining when to skip searching by search engines for duplicate uncompressed input data can reduce the encoding latency associated with compression in data center, networking, cloud, storage, or any computing environments.

FIG. 1 depicts a block diagram of a compression engine that selects a compression scheme to apply to an input data stream. A compression engine captures and analyzes heuristics during hash and search stages to select a lossless encoding algorithm. Heuristics can include one or more of: search string match length ("Len"), search distance offset from the search string match to a prior instance of the string ("Dis"), and a literal length distance between two pattern matches, expressed in length of the literals, from an end of a first pattern to start of a second pattern, where the second pattern is the same or different than the first pattern ("Lit Len"), as well as input stream size and input stream type. Lossless encoding schemes can include encoding schemes such as the LZ family including, but not limited to, LZ77, LZ4, LZS, Zstandard, DEFLATE, Huffman coding, and Snappy standards and derivatives. For example, Appendix 1 provides example descriptions of some encoding schemes including DEFLATE, Huffman, and LZ4. For example, LZ77 streams are described in Ziv et al., "A Universal Algorithm for Sequential Data Compression" IEEE Transactions on Information Theory (May 1977).

The following provides an example operation of the system of FIG. 1. Input data 102 is written into Look-Aside-Queue (LAQ) 104. Input data 102 can be uncompressed data of raw data code or a "literal" that designates the character as plain text or clear text. Input data 102 can be segmented at a character level or byte level. A byte can be a character for ASCII scheme. Other schemes can be used to represent characters such as UTF-8, where a character can span more than 1 byte.

Three pointers can be associated with Look-Aside-Queue 104, namely, a tail pointer, a head pointer, and a current pointer. The received uncompressed data 102 is inserted at the tail of LAQ 104. The tail pointer stores the location (entry) in LAQ 104 in which data can be inserted in LAQ 104. The head pointer identifies the entries in the LAQ 104 that store data that has been compressed using an encoder and can be flushed from LAQ 104. After data from LAQ 104 has gone through encoding, the data at the head pointer is flushed into HB 106 at the HB write pointer. The number of bytes flushed to HB 106 can vary depending on implementation and compression standard. The current pointer refers to the position at which the Hash Units 108 will get their next input data, and normally advances by the number of HUs 108 (e.g., 8 bytes). A HU is assigned a current stream position (e.g., "LQA", as in FIG. 3).

In some examples, hash units (HU) 108 can perform hash operations on 3 to 4 byte groups of input data from LAQ 104 to determine History Buffer Addresses (HBAs) of potential prior data positions where a match could be found. For example, compression scheme LZ4 uses a 4-byte hash function, whereas compression scheme DEFLATE uses a 3-byte hash function. Sizes other than 3 to 4 bytes can be used such as 1 byte, 2 bytes, 5 bytes, and so forth. In an example where HU 108 performs hash and lookup operations on 8 groups of bytes in parallel (e.g., groups with bytes 0-2, 1-3, 2-4, 3-5, 4-6, 5-7, 6-8, and 7-9 represented as groups 0 to 7 respectively), HU 108 can read groups 0-7 from LAQ 104 starting at the LAQ current position. For a 3-byte hash as an example, if the bytes in LAQ 104 are "ABCDEF-GHIJKLMN", then 8 hash functions are performed on the 3 bytes: "ABC", "BCD", "CDE", "DEF", "EFG", "FGH", GHI, and "HIJ". HU 108 hashes groups 0-7 and can search the hash results against hashes stored in hash table 120. A hash function is applied to produce a 12-bit hash table index, for example.

Hash table (HT) 120 can store hash values/index values and corresponding HBAs. In some embodiments, there are 32 banks of HT memory in order to reduce the average number of bank conflicts from the 8 Hash Units 108 read requests to the HT. A bank can provide up to 16 HBAs to the HU 108 requesting the bank. In some embodiments, 16 parallel Hash Tables (HTs) 120 are provided, allowing storing and retrieving up to 16 HBAs with a single hash table index. Retrieving up to 16 HBAs allows for up to 16 search operations for a given byte position. The hash index provides the read address (bank number plus location within the bank) to retrieve the HBAs. HT 120 can provide corresponding HBAs (e.g., up to 16) for a hash index. If there is no entry for a hash index in HT 120, HT 120 provides no HBA or an indication of an invalid entry. An HBA represents a prior stream position that is a potential match with a current group position. HU 108 can write a group position (e.g., 0-7) for the first 8 bytes of input data and corresponding hash index into an entry in HT 120. For subsequent input bytes, the group position would increase. A hash index can be the location (address) in the HT that can be read, written-to, or overwritten.

Hash Unit 108 compares the current stream position (LQA) against the retirement pointer when updating its corresponding SBQ entry or entries. A retirement pointer can indicate a position of the input data that has not been encoded into an LZ77 stream (or other stream) and is next in line to be encoded. The retirement pointer is updated during the encoding stage based on characters provided for inclusion in the LZ77 stream. The retirement pointer can indicate a position of the input data that has not been encoded into an LZ77 stream (or other stream) and is next in line to be encoded. If the retirement pointer is greater than the current stream position (LQA), Hash Unit 108 will set the Squash Bit (SQH) when updating its corresponding SBQ entry or entries.

HU 108 outputs to SBQ 110 identified history addresses (HBAs) and a valid indication (e.g., present in the HT 120 and in range of the History Buffer window). Agent 111 monitors SBQ 110 and in response to valid HBAs being available, agent 111 triggers one or more search units (SUs) 112 to perform a search for a prior portion of input data 102. SUs 112 attempt to find data string(s) from LAQ 104 or HB 106 using the HBA to find a match for an input data string.

SUs 112 retrieve from SBQ 110 one or more of (entry number, Stream ADDR (e.g., stream position LQA), history address (HBA)). Middle bits of the HBA can be used to convert an HBA to a position or memory location in LAQ 104 or HB 106. SU 112 compares data from LAQ 104 or HB 106 provided based on the HBA with characters of a group position for which HU 108 identified a potential match. In some examples, SU 112 can process chunks of 16 bytes or other sizes.

If a match is found, SU 112 supplies the Dis and Len that is found corresponding with its stream (group) position. A match selector 113 chooses a result from multiple SUs 112 with a longest character match (Len) and if Len of several search results are the same, a result with the smallest offset (Dis) is selected. Match selector 113 provides the Len and Dis to SBQ 110 for the character string associated with the selected Len and Dis and a character string (e.g., token) is available for encoding a corresponding current group position. If no match is found between any characters of the group position that caused the HU 108 to provide the HBA and the segment retrieved from LAQ 104 or HB 106 using the HBA, a literal is available for encoding a corresponding current group position. For example, for a hash involving bytes 0-2, a result will be placed in entry 0.

In some embodiments, when SUs 112 are finished searching a group of one or more character strings, a SWEEP_ME signal is triggered. SWEEP_ME state triggers deallocation to remove one or more entries from scoreboard queue 110 and copy input strings associated with deallocated entries from LAQ 104 to history buffer 106. Note that SWEEP_ME corresponds to a SWP state described later.

History buffer (HB) 106 can be used to store clear text data or plain text data ("history data") that has been processed by an encoder. The clear text data stored in the history buffer 106 can be referred to as a "dictionary." The dictionary can be created on the fly during compression and re-created on the fly during decompression. History buffer 106 acts a sliding window/circular queue. When the history buffer 106 is full, the oldest data at the head of the history buffer 106 is overwritten by data read from LAQ 104 that has been processed by an encoder. A size of HB 106 can vary depending on a compression standard used (e.g., DEFLATE, LZ4, LZ77). For example, HB 106 can be setup as 32 KB for DEFLATE compression and 64 KB for LZ4.

Scoreboard Queue (SBQ) 110 can be used by HU 108, SUs 112, and DDMM logic 116 as an information repository. In one example, SBQ 110 can track 64 consecutive stream positions (e.g., 0 to 63, 1 to 64, 2 to 65, and so forth). A position is the starting point for attempting to search for as long a match as possible. The following table provides a generic list of elements stored in an SBQ entry for a group byte position index.

| Element | Example Description |
| --- | --- |
| SBS | Indicates the present SBQ state (e.g., idle state, SU state, SWP state) |
| SBQ Idle (SBI) | When set this bit indicates that the SBQ is in use. This bit is cleared after the encoding. |
| Leading LAQ Byte (LQB) | The first byte of the 3-byte or 4-byte hash that was hashed. This can be the literal byte at the stream position (from the Hash Unit). |
| Leading Byte Address (LQA) | Location in LAQ for comparing against the History Buffer location(s). This can be the stream address (from the Hash Unit). |
| History Buffer Address [0:15] | In some examples, up to 16 History Buffer Address (HBA) are read from the HT 120 by HU 108. These HBAs are used for search operations in the LAQ 104 or HB 106. |

-continued

| Element | Example Description |
| --- | --- |
| Match Length[n]/ Match Offset Array[n] | List of search results from SUs. DDMM logic 116 can use these values to encode the input stream. |
| Search Match Offset (SMO) | Variable Dis from search units. |
| Search Match Length (SML) | Variable Len is Search Match Length (from SUs). |
| Squash bit (SQH) | DDMM logic 116 can set this bit to indicate that the leading LAQ byte has already been used by a previous match. |

According to some embodiments, Deallocation and Delay Match Mode (DDMM) 116 receives match results for consecutive input stream positions and decides which tokens (e.g., character or byte sequence) will be chosen for inclusion in an LZ compression stream encoding. DDMM 116 can delay the selection of token matches from multiple search results such that after a match of length N has been found, the DDMM 116 searches for a longer match starting at the next input position. For example, DDMM 116 can compare an identified token of a first stream position with tokens for the next two consecutive stream positions, and if either position has a longer match, the identified token for the first stream position is converted into a literal. DDMM 116 can hold a match result of a token for a position to make a delayed match decision based on literals or token(s) for next consecutive or later stream positions.

For example, from SBQ 110, available literal or token representations of three consecutive entries can be examined to determine whether to provide any token in the consecutive entries to an LZ77 stream or to use the literal instead. In other embodiments, more or fewer than three consecutive entries can be examined. For example, when consecutive entries 0-2 have search results indicating a literal and zero or more tokens, and entry 0 represents a portion of an input stream that is received earlier in time than that of entry 1, and entry 1 represents a portion of an input stream that is received earlier in time than that of entry 2. In a case where entry 0 is a literal, the literal for entry 0 can be encoded in an LZ77 stream. However, if entry 0 is represented by a token that is longer than a token for entry 1 and a length of a token for entry 2 is not two or more characters longer than a length of a token for entry 0, then the token for entry 0 is provided for inclusion in the LZ77 stream. If entry 0 is represented by a token that is longer than a token for entry 1 and entry 2 is a literal, then the token for entry 0 is provided for inclusion in the LZ77 stream. If entry 0 is represented by a token, entry 1 is a literal, and entry 2 is a literal, then the token for entry 0 is provided for inclusion in the LZ77 stream.

In some embodiments, if entry 0 is represented by a token, entry 1 is represented by a token, and if the token for entry 1 is longer than the token for entry 0, then the entry 0 is reverted to its literal and provided for inclusion in the LZ77 stream but the token for entry 1 is held for a delayed match decision against literal(s) or zero or more token(s) in later stream positions. The token for entry 1 can be held for examination of entries 1, 2, and 3 or entry 1 and other entries.

In some embodiments, if entry 0 and entry 1 are represented by tokens, but the token for entry 1 is not longer than the token for entry 0, and the entry 2 is represented by a token that is at least two characters longer than the token representing entry 0, then the tokens for entry 0 and entry 1 are rejected and literals corresponding to entry 0 and entry 1 are provided for inclusion in the LZ77 stream. In other examples, instead of at least two characters difference between a token for entry 2 and a token for entry 0, other numbers can be used such as 1, 3, 4 and so forth. The token for entry 2 can be held for examination of entries 2, 3, and 4 or entry 2 and other entries.

DDMM 116 can maintain a retirement pointer that identifies a next stream position that has not been included in the LZ77 stream (or other type of stream, e.g., LZ78) for the input data stream. The retirement pointer can be updated to refer to the next position in an input stream that has not been selected for inclusion in the LZ77 stream. After DDMM 116 selects a token or literal for an input stream position, the retirement pointer is updated to point to a literal after the token or literal that has been selected for inclusion in the LZ77 stream. The retirement pointer is also sent to SBQ 110 to squash SBQ entries that are less than the current retirement pointer because those results will not be used.

DDMM 116 can squash (suppress) incoming stream positions that are less than the current retirement pointer from inclusion into the LZ77 stream. In cases where the current position pointer (LQA) does not match the retirement pointer, a literal or token referred to by the current position pointer can be discarded and the current position pointer can be advanced.

DDMM 116 can stop one or more search units from searching for matches within an incoming uncompressed data stream. Advancing the retirement pointer frees search units to search after the committed literal or token and avoid performing operations that have been completed. SUs 112 corresponding to squashed SBQ entries can stop search for matches and powered down or allocated for searching for matches for other SBQ entries.

DDMM device 116 can use contents of the SBQ entries to generate a representation of an input data stream and the representation can be an LZ77 stream. Deallocation and delayed match mode (DDMM) device 116 receives or retrieves serial, in-order, results from SBQ 110 indicating Dis, Len, and a literal (as the case may be) for a group position. For example, DDMM device 116 receives the match results for 8 consecutive stream positions from SBQ 110 and decides which tokens will be chosen for the LZ77 stream. DDMM 116 generates an LZ77 stream with literals and zero or more tokens. DDMM 116 can generate a literal length (Lit Len) for an LZ77 stream, where literal length can represent a gap, expressed in length of the literals, between two pattern matches (e.g., tokens) from an end of a first pattern to start of a second pattern, where the second pattern is the same or different than the first pattern. For example, DDMM 116 provides Output Encoding Logic (OEL) the following information directly or via Score Board Queue (SBQ).

| Field | Example description |
| --- | --- |
| Valid | Valid bits for 8 possible LZ77 results. |
| EOF | Indicates the last set of LZ77 output, or if none of the output is valid, that no more LZ77 output is available. |
| Length | Lengths for 8 LZ77 results. A length of 1 indicates a literal (value = LQB), otherwise a <Length, Distance> pair (token). |
| Distance | Distances for 8 LZ77 results. |
| Literal Length | A gap between pattern matches. |
| LQB | Leading bytes for the 8 LZ77 results (used for literals) |

If delayed match decision mode is disabled and a candidate token is not held for comparison against subsequent tokens or literals to determine whether the candidate token is to be included in the LZ77 stream, DDMM 116 can perform the following. When a literal is encountered at an input stream position i and is not squashed, it is directly sent to OEL 122, and the retirement pointer is incremented to position i+1. When a token of length L is encountered at stream position i and is not squashed, it is directly sent to OEL 122 and the retirement pointer is advanced to stream position i+L. As a result, the next (L−1) stream positions are squashed and DDMM 116 can send the next literal or token starting at stream position (i+L).

Compression scheme selector (CSS) module 114 can use literal length (Lit Len) from DDMM 116 and Dis and Len from DDMM 116 or SBQ 110. CSS module 114 can select a compression engine to use (e.g., LZ4, DEFLATE, Zstandard (ZSTD), LZS, none, and so forth) to compress the LZ77 format stream and provide a compressed output. For example, compression scheme selector (CSS) module 114 can perform any of one or more: (1) calculate percentage representations of Len, Dis, Lit Len; (2) calculate standard deviations of Len, Dis, and Lit Len; (3) compare those values against pre-determined criteria; and (4) determine encoding/compression scheme for Output Encoding Logic 122 to use to encode/compress an LZ77 stream based at least on the criteria. For example, criteria for selecting a compression engine can be based on a scheme depicted in FIG. 2. Criteria for selecting an encoding scheme can be set by cloud/communications service provider or generated by artificial intelligence (AI).

FIG. 2 depicts an example table that illustrates criteria that can be used to select a compression scheme for an input data stream or portion of the input data stream. For an input stream, a compression scheme can be determined based on one or more criteria among: a size and type of an input stream, a length of a pattern (e.g., Len), a distance from a start of where the pattern is to be inserted to the beginning of where the pattern began (e.g., Dis), a gap between two pattern matches, standard deviation of a length of a pattern, standard deviation of distance from a start of where the pattern is to be inserted to the beginning of where the pattern began, or standard deviation of gap between two pattern matches. For a row, a size of an uncompressed input stream is a sequence of characters to be compressed and is shown in kilobytes and megabytes but other sizes can be used. A file type is shown as text, image, media, although other types can be used.

Criteria Percentage of Search MATCH Length (Match Len) Lengths can indicate a percentage of repeated string sizes in a file of a size and type that are needed to satisfy this column for the input stream or portion of the input stream. Match Len can be a length of a repeated character string. An entry of * indicates an entry can be satisfied with any value.

Criteria Percentage of Search Distance (Dis) OFFSET Lengths can indicate a percentage of values of Dis in a file of a size and type that are needed to satisfy this column for the input stream or portion of the input stream. Variable Dis indicates a backwards distance in history from current position back to a beginning position of the match. An entry of * indicates an entry can be satisfied with any value.

Criteria Percentage of Search Literal Length (Lit Len) indicates a percentage of values of literal length in a file of a size and type that are needed to satisfy this column for the input stream or portion of the input stream. Literal length can represent a distance between two pattern matches, expressed in length of the literals, from an end of a first pattern to start of a second pattern, where the second pattern is the same or different than the first pattern. An entry of * indicates an entry can be satisfied with any value.

Criteria Standard Deviation of Match Len Freq Counts indicates a standard deviation of variable Match Len (or Len) for the input stream or portion of the input stream. An entry of * indicates an entry can be satisfied with any value.

Criteria Standard Deviation of Dis Freq Counts indicates a standard deviation of variable Dis for the input stream or portion of the input stream. An entry of * indicates an entry can be satisfied with any value.

Criteria Standard Deviation of Lit Len Counts indicates a standard deviation of variable Lit Len for the input stream or portion of the input stream. An entry of * indicates an entry can be satisfied with any value.

For an input file size and file type that matches criteria of the table, a compression scheme can be chosen. For example, ZSTD compression scheme can be used for a file size that is 1.5 kilobytes, is a text file, has 70% of pattern matches that are 6 bytes (e.g., characters) in length and 4% of pattern matches are 68 bytes in length, has 3% of gaps between pattern matches of 70 bytes, has 30% of gap between two pattern matches of 4 bytes and 30% gap between two pattern matches of 12 bytes, standard deviation of 5% for variable Match Len, and standard deviation of 10% of Lit Len.

If criteria of multiple encoding schemes are met, a priority order of encoding schemes can be applied where a higher priority scheme is selected for use. For example, if an input stream converted to LZ77 format meets criteria for ZSTD and DEFLATE Dynamic and ZSTD is a higher priority scheme than DEFLATE Dynamic, then ZSTD is used for encoding the LZ77 format stream. In other embodiments, if criteria of multiple encoding schemes are met, a less utilized encoder can be selected for use.

FIG. 3 depicts examples of input stream representations. In this example, outputs of representations of input data without using delay match mode and using delay match mode are shown. Repeated characters or sequences of characters can be represented as tokens indicating a length of character sequences and offset from a prior occurrence of the sequence. The length of character sequence can be tuned between using more and shorter sequences or longer but fewer sequences. In some cases, such as delay match mode, longer characters sequences are chosen. The output tokens are in the form <Len, Dis>.

In the example, an input data is "Light eaters rather like heated theaters". Without use of various embodiments, the input data is represented as:

Light eaters rather like h<4,20>d<3,17><5,28> where:

<4,20> refers to a character sequence of length 4 ("eate") and that the sequence begins 20 characters immediately before the start of the character sequence of "eate" and includes spaces;

<3,17> refers to a character sequence of length 3 ("the") and that the sequence begins 17 characters immediately before the start of the character sequence of "the" and includes spaces and an expansion of <4,20> into 4 characters; and <5,28> refers to a character sequence of length 5 ("aters") and that the sequence begins 28 characters immediately before the start of the character sequence of "aters" and includes spaces and an expansion of <4,20> into 4 characters and an expansion of <3,17> into 3 characters.

In this example, with use of delay match mode to use longer character sequences, the input data is represented as:

Light eaters rather like h<4,20>d th<6,28> where:

<4,20> refers to a character sequence of length 4 ("eate") and that the sequence begins 20 characters immediately before the start of the character sequence of "eate" and includes spaces;

<6,28> refers to a character sequence of length 6 ("eaters") and that the sequence begins 28 characters immediately before the start of the character sequence of "eaters" and includes spaces and an expansion of <4,20> into "eate".

Figure 4A:
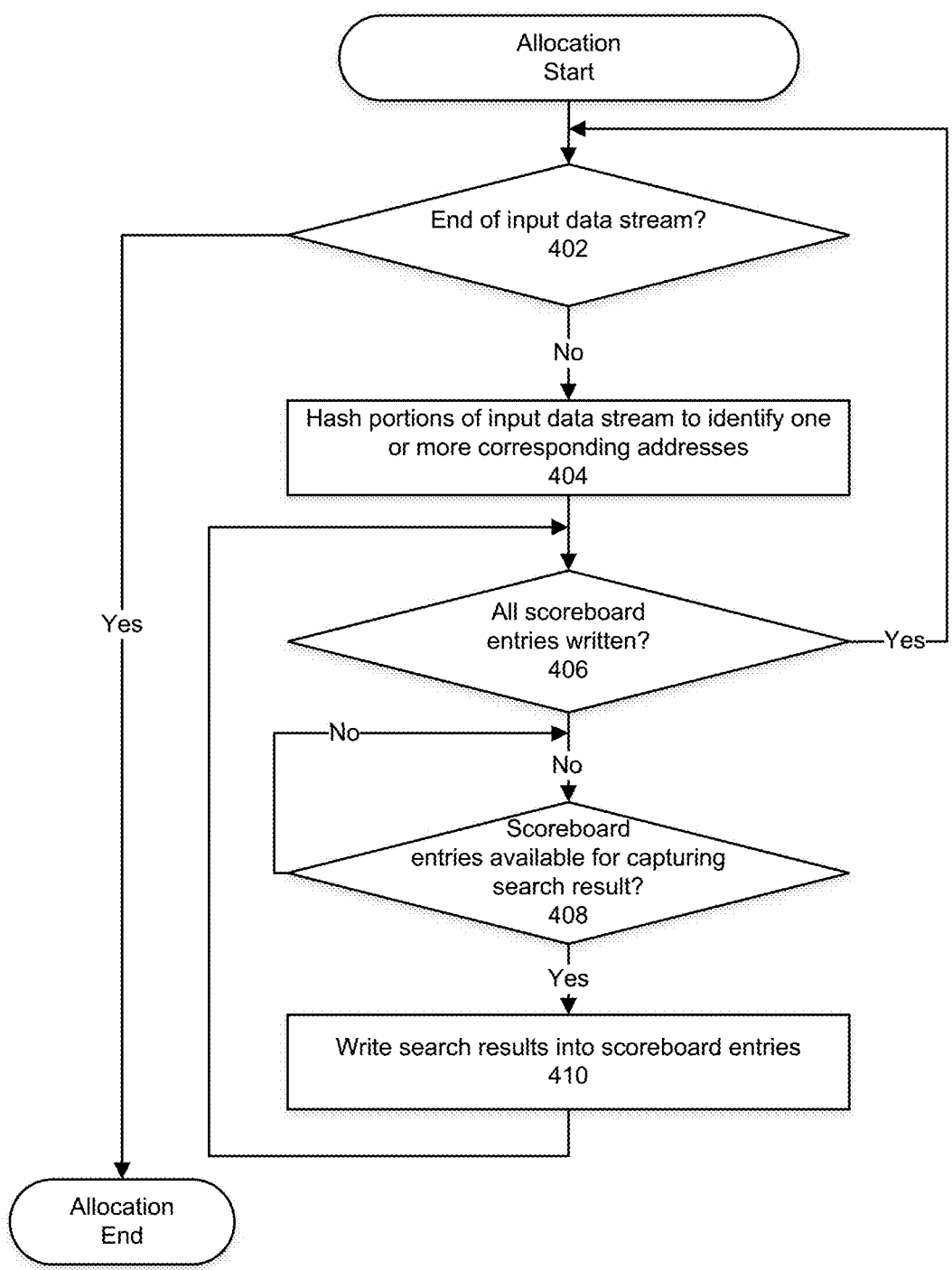
FIG. 4A provides a process that can be used by a hash unit to identify a potential character string match for a portion of an input stream in accordance with an embodiment.

FIG. 4A provides a process that can be used by a hash unit to identify a potential character string match for a portion of an input stream. At 402, a determination is made as to whether an end of an input data stream has been reached. For example, a last input LQA pointer can indicate an end of an input data stream. There is an indication to the hash unit that the LAQ tail pointer has reached its final value, and thus the hash unit will be able to identify the last group position (e.g., LQA). If an end an input stream is reached, then the process can end. If an end of an input stream is not reached, then 404 can follow.

At 404, a portion of an input data stream can be hashed and the hash value used to identify one or more corresponding addresses in a hash table. The address can be associated with an entry in an input buffer (e.g., LAQ) or history buffer. If the hash value has a corresponding address, the address can be provided to a scoreboard queue (SBQ). However, if the hash value does not have a corresponding address, the scoreboard queue (SBQ) can be updated to indicate there is no address.

At 406, a determination is made as to whether all scoreboard entries have been written. For example, all scoreboard entries can be written if a scoreboard is full. If all scoreboard entries are written, then 402 can follow. If all scoreboard entries are not written, then 408 can follow.

At 408, a determination is made as to whether a scoreboard entry is available to capture a search result. For example, one or multiple (e.g., 16) addresses can be available from a look-up operation in 404 and if an entry or entries are available to capture (store) the results, then 410 follows. If an entry or entries are not available to capture (store) the results, then 408 repeats. At 410, search results can be written into a scoreboard entry. For example, a hash unit can write addresses identified in 404 into one or more available scoreboard entries.

Figure 4B:
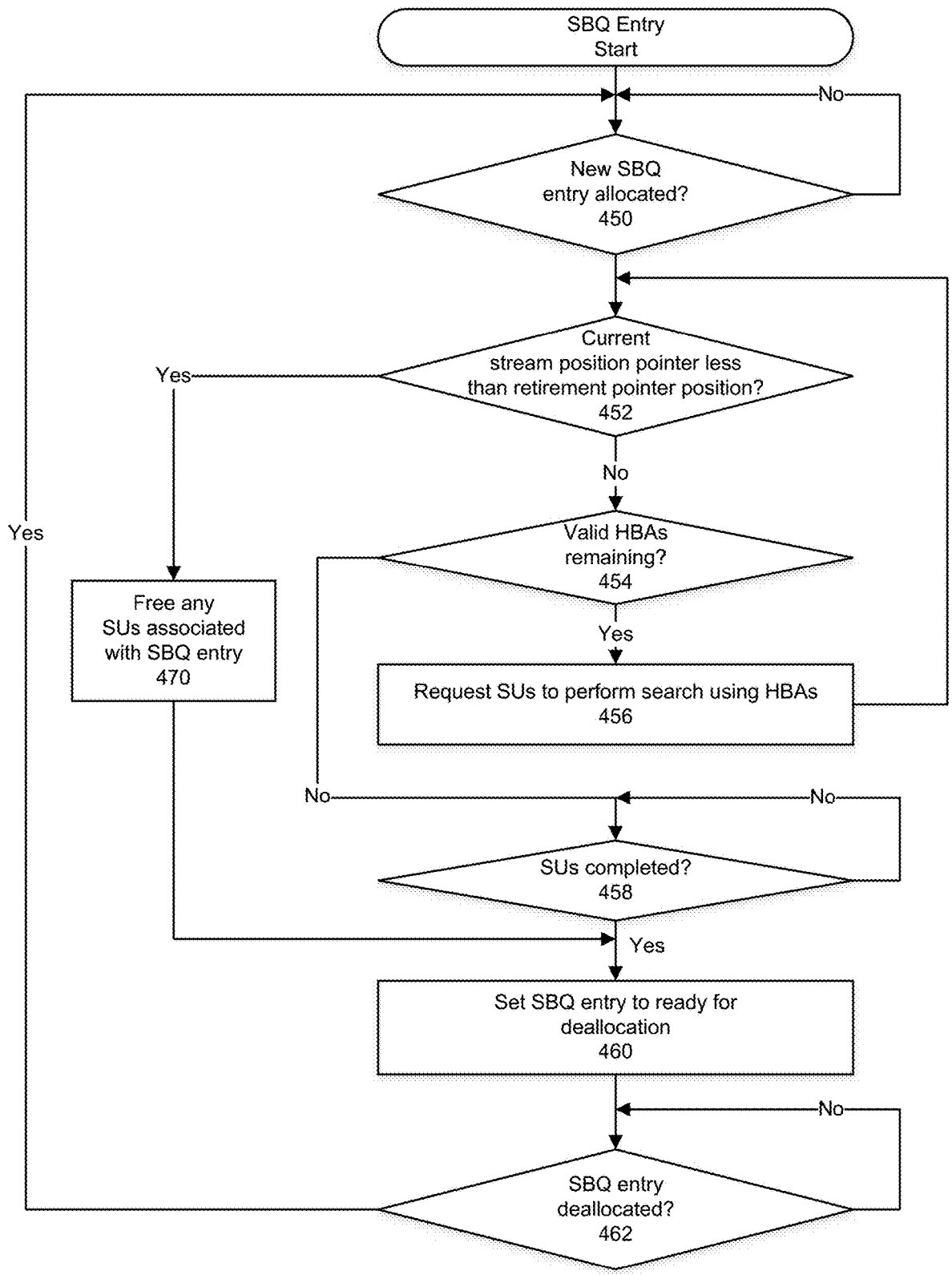
FIG. 4B depicts a process that can be used to manage operations of one or more search units in accordance with an embodiment.

FIG. 4B depicts a process that can be used to manage operations of one or more search units. For example, the process of FIG. 4B can be used by a state machine logic that monitors entries in a scoreboard queue to allocate a search unit to perform a search. At 450, a determination is made as to whether a new scoreboard queue (SBQ) entry has been allocated. For example, allocation of a new SBQ entry can include availability of one or more history buffer addresses (HBAs) for an SBQ entry. At 452, a determination is made as to whether a current stream pointer position is less than a retirement pointer position. A retirement pointer position can represent a next stream position that has not been provide for inclusion in an encoding stream (e.g., LZ77 stream). A current stream pointer position is less than a retirement pointer position if the current stream pointer position is an older position (e.g., character has been received earlier in time) than that referred to by the retirement pointer. If the current stream pointer position is less than a retirement pointer position, then 470 can follow. If the current stream pointer position is greater than or equal to the retirement pointer position, then 454 can follow.

At 454, a determination is made as to whether one or more valid HBAs are available for processing. An HBA can be marked invalid after used for a search by an SU. If one or more valid HBAs are available for processing, then 456 can follow. If one or more valid HBAs are not available for processing, then 458 can follow.

At 456, a request can be made to a pool of one or more SUs to perform a search for a character string match beginning with the current stream position using an address provided using the one or more HBAs. An SU can process a search on one HBA and multiple SUs can be requested to perform searches. Action 452 can follow 456.

At 458, a determination is made as to whether the one or more SUs are completed determining matches. SUs can be considered completed after they have completed attempting matches on their HBAs. If the one or more SUs have not completed determining matches, then 458 repeats until SUs are completed searching. If the remaining one or more SUs have completed determining matches, 460 follows.

At 460, the SBQ entry is set to ready for deallocation. The entry can be updated to change the state to SWEEP. A deallocator can make the SBQ entry with SWEEP state available for reuse. At 462, a determination as to whether the SBQ entry set for deallocation has been deallocated. Action 462 is repeated until the SBQ entry is deallocated.

At 470, any search units (SUs) associated with an SBQ entry associated with the current stream position pointer can abort search activities for matches against prior portions of the input stream. For example, a current stream pointer position can refer to the current SBQ entry. The SUs that abort search activities can perform other search activities or power down. Action 460 can follow action 470 whereby the SBQ entry associated with the current stream position pointer can be set to ready for deallocation.

Figure 5A:
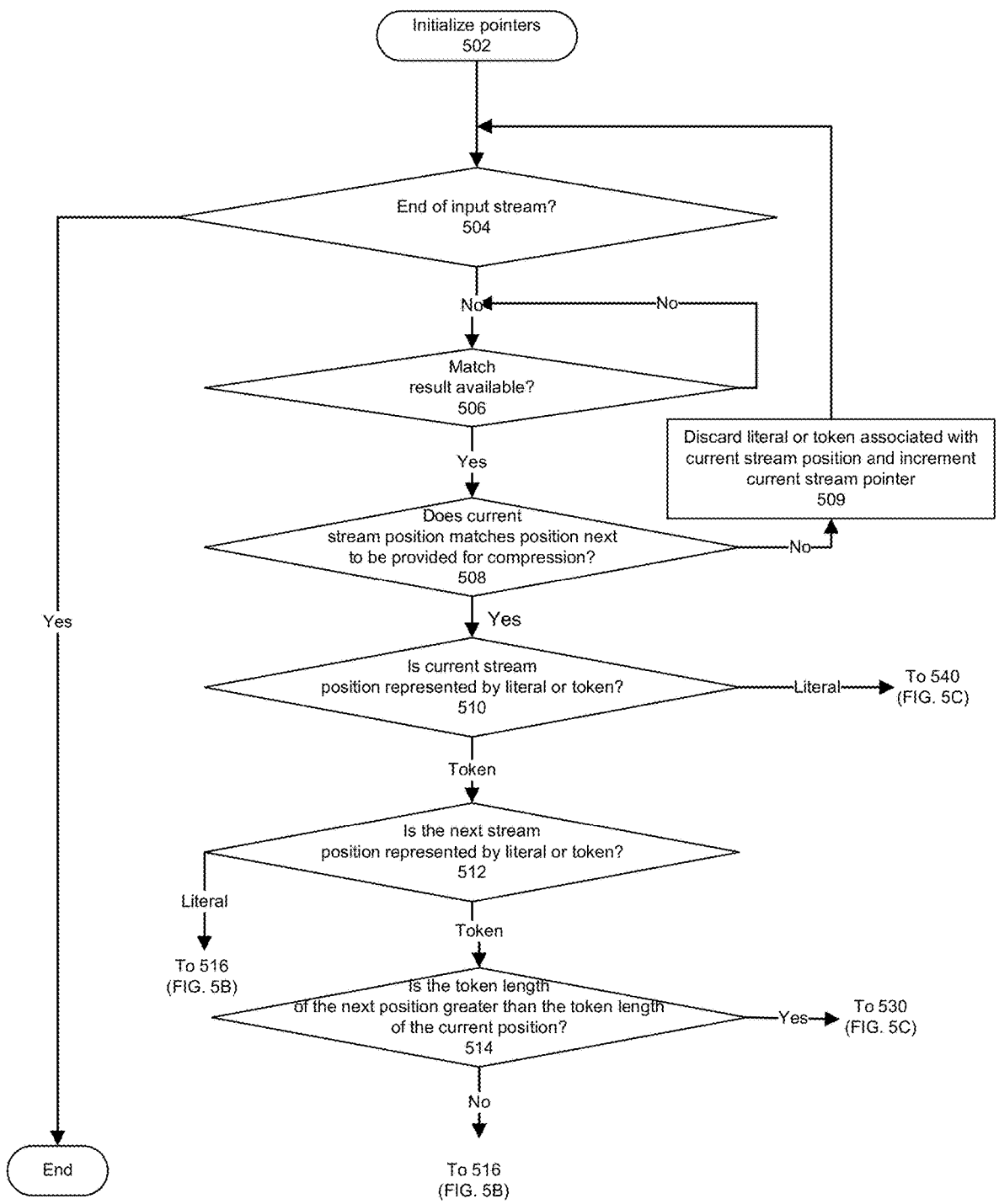
FIG. 5A-5C depicts a process that can be used to determine whether to select a literal or token for inclusion in an output stream in accordance with an embodiment.
Figure 5B:
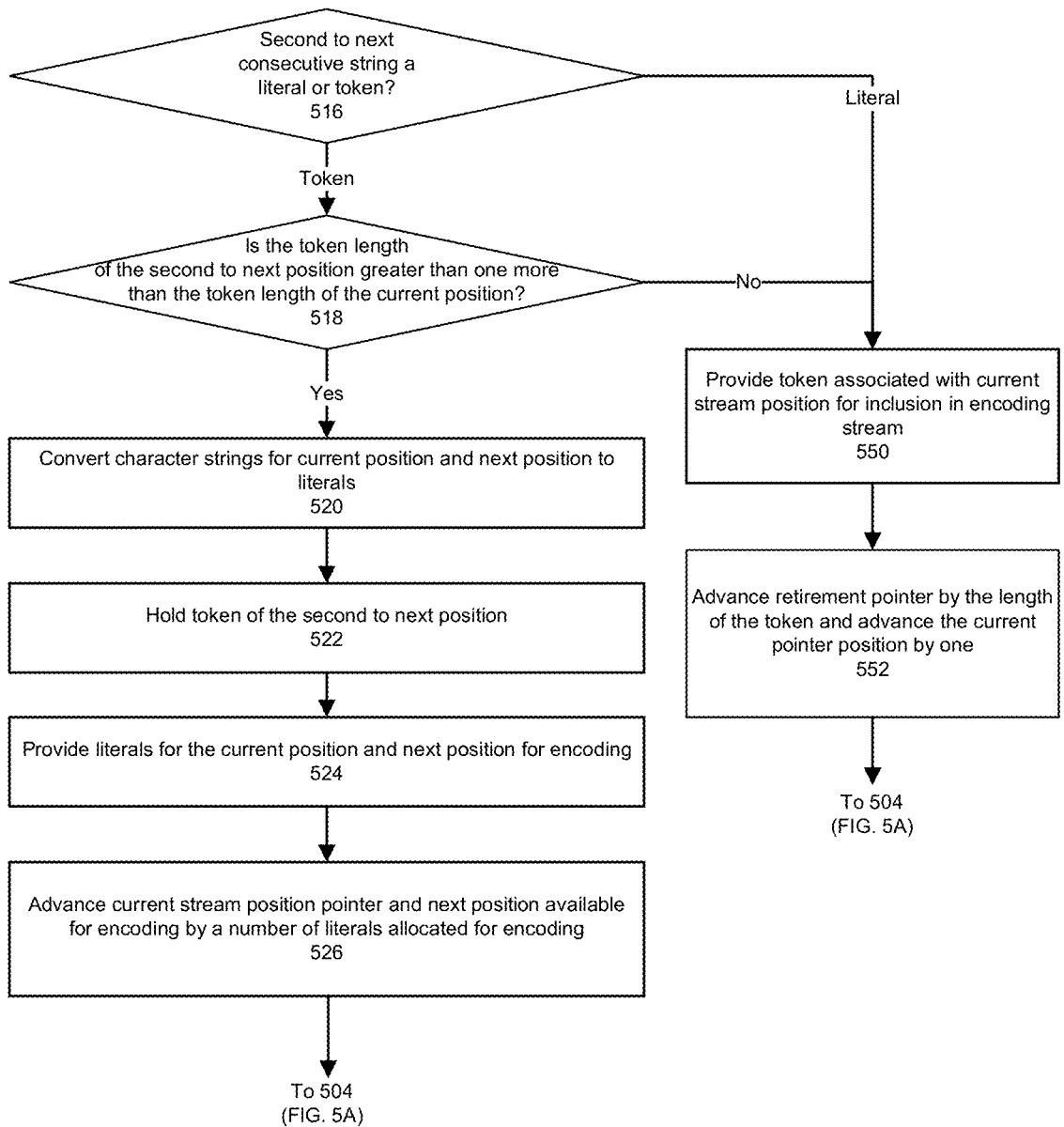
Figure 5C:
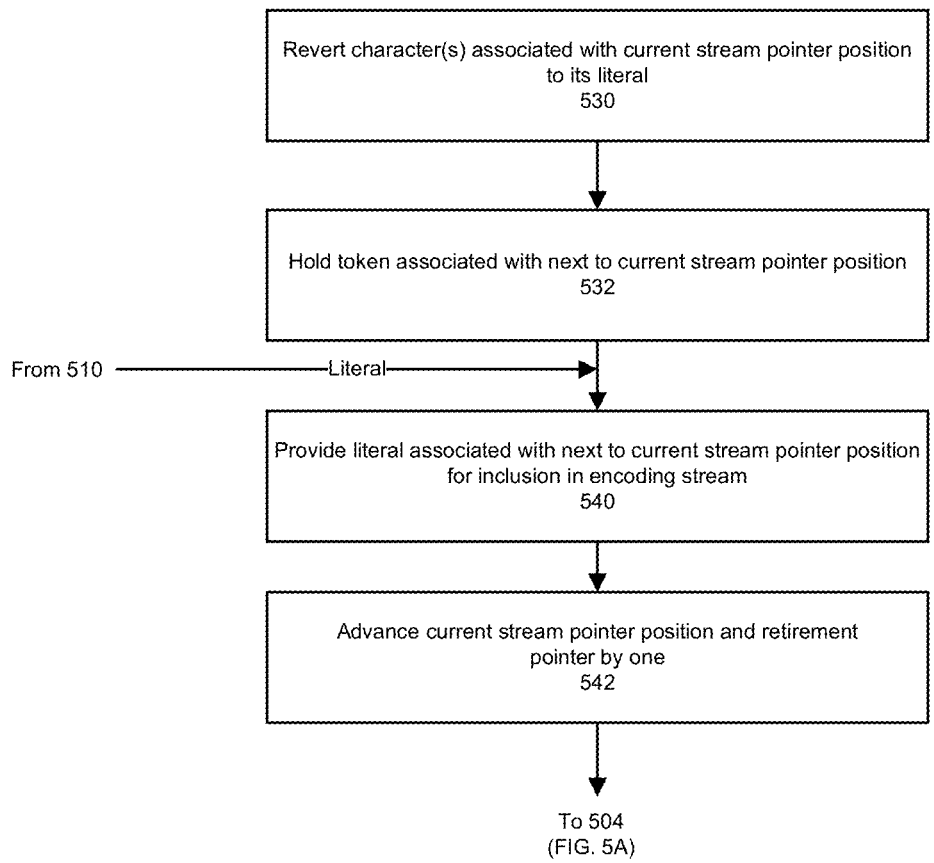

FIGS. 5A-5C depict a process that can be used to determine whether to select a literal or token for inclusion in an output stream. For example, Deallocation and Delay Match Mode (DDMM) can use or perform the process. Referring to FIG. 5A, at 502, pointers are initialized to zero. For example, an LQA pointer (e.g., current position in input stream) and retirement pointer (e.g., position next available for inclusion in an output stream) can be initialized to 0. At 504, a determination is made as to whether a last stream position has been processed. For example, if an input stream is at its end, then the determination is made that the process ends. For example, an LQA pointer that refers to an end of an input stream indicates the input stream is at its end. If the end of an input stream has not been processed, 506 follows. At 506, a determination is made as to whether a match result is available. For example, a match result can be indicated by a length of match (e.g., Len) and distance from a prior occurrence of the match (e.g., Dis). If a match result is available, then 508 follows. If a match result is not available, then 506 repeats until a match result is available.

At 508, a determination is made as to whether a current stream position matches a position that is next to be provided for compression. If the current stream position does not match a position that is next to be provided for compression, then 509 follows. In general, the current stream pointer can trail or match the retirement pointer.

At 509, a literal or token associated with the current stream position pointer (e.g., literal or token) is discarded and the current stream position pointer is incremented for example by 1. In this scenario, a current stream pointer position refers to a position for which a token has been provided for possible inclusion in an encoding stream. A loop including actions 504, 506, 508 and 509 repeats until the current stream pointer matches the position next to be provided for inclusion in an encoding stream. When the retirement pointer is ahead of the current position pointer, search units associated with squashed positions between and including the current position pointer and the retirement pointer can cease searching for characters beginning at the squashed positions, powered down, or allocated for searching for matches for other SBQ entries.

Referring again to 508, if the current stream position matches a position that is next to be provided for compression, then 510 follows. At 510, a determination is made as to whether the representation of character or character string (e.g., literal or token) identified by the current input stream position pointer is a literal or token. If the representation is a token, then 512 follows. If the representation is a literal, 540 follows (FIG. 5C).

At 512, a determination is made as to whether the representation of character or character string identified by the next input stream position is a literal or token. If the next input stream position is represented by a token, then 514 follows. If the next input stream position is represented by a literal, 516 follows.

At 514, a determination is made as to whether the token length of a token representing a character or character string associated with the next input stream position is greater than the token length of a token representing a character or character string identified by the current input stream position. If the token length of a token representing a character or character string associated with the next input stream position is greater than the token length of a token representing a character or character string associated with the current input stream position, then 530 follows. If the token length of a token representing a character or character string associated by the character or character string associated with the next input stream position is not greater than the token length of a token representing a character or character string identified by the LQA, then 516 follows.

At 516, a determination is made as to whether the representation of character or character string identified by the character or character string associated with the next input stream position (the second next and newer position after the current input stream position) is a literal or token. If the character or character string is a token, a current input stream position and the next two consecutive input stream positions are all represented by tokens and 518 follows. If the character is a literal, a current input stream position, the next input stream position, and the following input stream position are represented by respective token (e.g., LQA+2), token, literal and 550 follows.

At 518, a determination is made as to whether the token length of a token representing a character or character string identified by the second next input stream position is greater than the token length of a token representing a character or character string identified by the current input stream position but increased by one (1). If the token length of a token representing a character or character string identified by the second next input stream position is greater than the token length of a token representing a character or character string identified the current input stream position as increased by one (1), then 520 follows. If the token length of a token representing a character or character string identified by the second next input stream position is not greater than or equal to the token length of a token representing a character or character string identified the current input stream position as increased by one (1), then 550 follows.

At 520, a character or character string associated with the current input stream position is converted to its literal and a character or character string associated with the next to current input stream position is converted to its literal. Accordingly, tokens represented by current input stream position and the next to current input stream position (one position newer than the current input stream position) are rejected and a token represented by position the second to next current input stream position (two positions newer than the current input stream position) is accepted. In other embodiments, 518 is satisfied by a length of token of a second to next to current input stream position being one or three or more better than a length of token of a current input stream position. At 522, a token representing a character or character string associated with the second to next to current input stream position is held. The token can be used in a comparison involving third or fourth to next to current input stream positions (or other positions) in another iteration of the process of FIGS. 5A to 5C.

At 524, literals for positions associated with the current input stream position and next to current input stream position are providing for encoding. For example, the literals can be provided for inclusion in an LZ77 representation of an input data stream. At 526, pointers for the current input stream position and the next position available for encoding (e.g., retirement pointer) are advanced for example by the number of literals allocated for encoding. The pointers can be incremented by two to represent that the next two positions have been provided for encoding and both pointers are advanced by two and be synchronized. The current pointer would point to the second to next to the current position. The process returns to 504.

Referring next to 550, a token associated with the current position pointer is provided for inclusion in an encoded stream representation of an input data stream. At 552, a retirement pointer is incremented by a length of the token for position represented by the token provided for inclusion in the encoding stream but the current position pointer is incremented by 1. After the changes to the current position pointer and the retirement pointer, the current position pointer and the retirement pointer are not in synch. The process returns to 504 (FIG. 5A). In a subsequent iteration of 504, 506, 508, and 509, the literal or token associated with the current position pointer is discarded until the current position pointer is advanced enough to equal the position referred to by the retirement pointer.

Referring to FIG. 5C, at 530, where characters associated with the current input stream position and the next to current input stream position are both represented as tokens, a token associated with the current input stream position is reverted to its literal. At 532, a token represented by next to current stream position is held and not sent for inclusion in the encoding stream. Thereafter, the token can be compared against any token in a position that follows (in time) the held token. At 540, a literal for position represented by the current stream position is sent for inclusion in an encoding stream representation of an input data stream. At 542, the current stream position pointer and retirement pointer are advanced for example by 1. Advancing the current stream position pointer and retirement pointer positions by one occurs when a literal provided for encoding is one character and a character occupies a single position. The current stream position pointer and retirement pointer are in synch at this point. The process returns to 504 (FIG. 5A).

Figure 6:
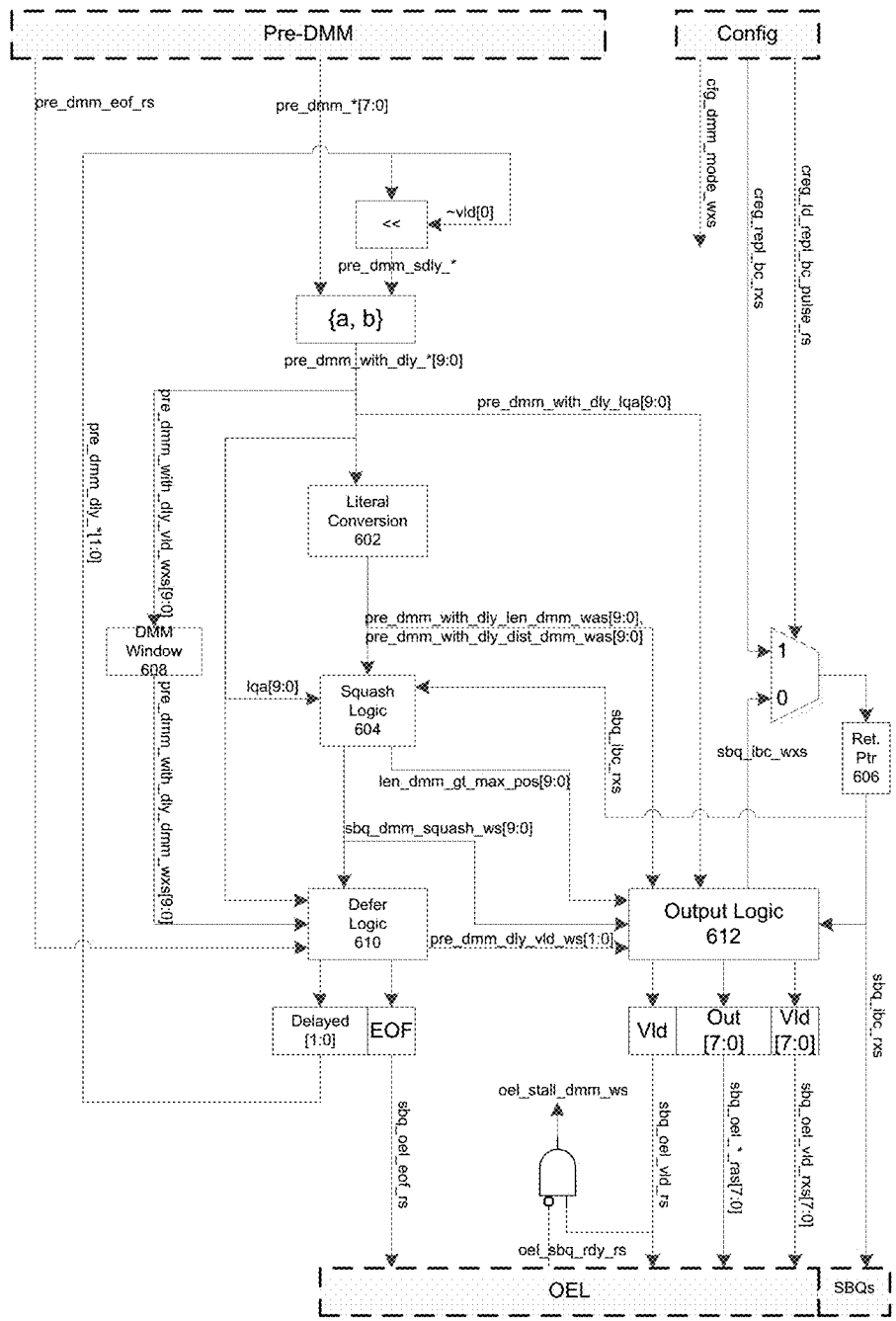
FIG. 6 depicts a block diagram of an example system in accordance with an embodiment.

FIG. 6 depicts a block diagram of an example system. The system can be used to determine whether to select a token or literal for an entry for inclusion in an encoded stream based on whether one or more other entries are a literal or token and token size. Multiple result selections can occur in parallel. The system can be used as concatenation logic to concatenate incoming results with referred results. Literal conversion logic 602 implements the Delay Match Mode (DMM) decision approaches described in embodiments herein. Squash logic 604 determines whether a result is squashed and updates Retirement Pointer 606. DMM window logic 608 marks the region where results may need to be deferred. Defer logic 610 determines which results will be deferred until more incoming results are received. Deferred entries are held until more incoming valid entries are received. Output logic 612 outputs results to the Output Encoding Logic that are not deferred or squashed.

The DMM operating mode is determined by the DMM mode configuration bit. A DMM mode configuration bit of 0 indicates DMM is disabled. When a literal is encountered at stream position i and is not squashed, it is directly sent to the OEL, and the Retirement Pointer is incremented to position i+1. When a token of length L is encountered at stream position i and is not squashed, it is directly sent to the OEL, and the Retirement Pointer is advanced to stream position i+L. As a result, the next (L−1) stream positions are squashed. The DMM will send the next literal or token starting at stream position (i+L).

A DMM mode configuration bit of 1 indicates DMM is enabled. When a literal is encountered at stream position i that is not squashed, it is directly sent to the OEL, and the Retirement Pointer is incremented to position (i+1). When a token of length L is encountered at stream position i and is not squashed, the match lengths at positions (i+1 of length M) and (i+2 of length N) are examined before a decision can be made as to what will be sent to the OEL. Position i is selected in some examples if position (i+1) has length<(L+1) and position (i+2) has length<(L+2), the token for position i is sent to the OEL and the Retirement Pointer is advanced to position (i+L).

Position (i+1) can be selected if position (i+1) has length M>=(L+1) and position (i+2) has length N<(M+1). Position i is converted to a literal and sent to the OEL. Retirement Pointer can be advanced to position (i+1).

Position (i+2) can be selected if position (i+2) has length N>=(L+2) and N>=(M+1). Position i can be converted to a literal and (if not already a literal), position (i+1) can be converted to a literal and both literals are sent to the OEL. Retirement Pointer can be advanced to position (i+2).

In an example, the system of FIG. 6 receives incoming entries (e.g., up to 8) from the pre-DMM block are concatenated with deferred entries (e.g., up to 2) to create a set of pre-DMM with delay results (e.g., up to 10). If there is only one deferred entry, it is left shifted by 1 to be contiguous with the incoming entries. A position i of the concatenated entries is examined starting from i=0 up to i=9. Literal conversion logic 602 can decide whether to provide a literal or token for a position. If the match length at position i is less than the programmed Lazy threshold, the length is compared with those at positions (i+1) and (i+2), and if either of those positions have a better match length as previously described for DMM mode, the match at position i is converted to a literal (match length of 1). If the result at position (i+2) is not valid, only the comparison with position (i+1) is performed. If position (i+1) is also not valid, no comparisons are performed and the result at position i is unchanged.

An example description of DMM window is provided next. When DMM is enabled, the last 2 valid concatenated entries are tagged as being in the DMM defer region (window), which can be one of the conditions used to determine whether a match result will be deferred until the next cycle. The DMM window is initialized so that positions 9 and 8 are set and the remaining positions are 0's. DMM window logic 608 counts the number of invalid pre-DMM with delay results starting from position 9 until the first valid result is encountered. The DMM window is then shifted right by this count.

An example description of defer logic 610 is provided next. A concatenated entry at position i is deferred when all of the following conditions are true: (1) pre-DMM EOF (end of file) has not been set (e.g., subsequent match results are pending from the SBQ); (2) the position is in the DMIM window (one of the last 2 valid positions); (3) either of the following is true: (a) the previous position has been deferred or (b) the position is a token that was not converted to a literal, with a length less than the lazy parameter. EOF indicates this is the last set of results from the pre-DMM (or deallocator). If EOF is not set, then more results are expected later to continue comparing deferred tokens with future positions. A lazy parameter can be set as a length threshold. If a token's length is >=lazy parameter and not squashed, then the token is immediately sent for encoding without comparing with the next stream positions.

An example description of output logic 612 is provided next. Concatenated entries that are not deferred and not squashed are packed into a contiguous set of results (up to 8 in the case of all literals) to the OEL starting from position 0 of the SBQ to OEL interface signals. Squashed entries are skipped and not provided to the OEL. Deferred entries are stored in registers until the next valid incoming results from the pre-DMM block are received.

Output logic 612 also updates retirement pointer 606 as follows: (1) initialize the Short Match Length Sum and Long Match Length to 0; (2) for result at position i sent to the OEL: if the match length saturated, set the Long Match Length to the match length at position i, otherwise add the match length at position i to the Short Match Length; and (3) add Short Match Length and Long Match Length to the prior Retirement Pointer.

When replay mode is enabled when writing the configuration register, retirement pointer 606 is loaded with the Replay Byte Counter. This can ensure that retirement pointer 606 will match the LQA (pointer) of the first result received from the Pre-DMM block.

The following table provides an example description of an DMM interface description for signals used in FIG. 6.

| Name | Width | Type | Dir | Example Description |
|---|---|---|---|---|
| Clock/Reset | | | | |
| ssm_clk | 1 | logic | I | |
| ssm_rst_rns | 1 | logic | I | |
| Configuration | | | | |
| creg_repl_bc_rxs[16:0] | 17 | logic | I | Replay Byte Count |
| cfg_dmm_mode_wxs | 1 | logic | I | DMM mode. 0 DMM is off, 1 EDMM is ON |
| pre_dmm_eof_rs | 1 | logic | I | SBQ Slice Final |
| creg_ld_repl_bc_pulse_rs | 1 | logic | I | Load Replay Byte Count |
| From Pre-DMM | | | | |
| pre_dmm_dist_ras[7:0][15:0] | 128 | logic | I | Distance (per Hash) |
| pre_dmm_len_ras[7:0][8:0] | 72 | logic | I | Length (per Hash) |
| pre_dmm_len_lt_lazy_rxs[7:0] | 8 | logic | I | Length < lazy |
| pre_dmm_lqa_ras[7:0][15:0] | 128 | logic | I | LAQ Address (per Hash) |
| pre_dmm_lqb_ras[7:0][7:0] | 64 | logic | I | Leading LAQ Byte (per Hash) |
| pre_dmm_vld_rs | 1 | logic | I | Valid output set |
| pre_dmm_vld_rxs[7:0] | 8 | logic | I | Valid output (per Hash) |
| To SBQs | | | | |
| sbq_ibc_rxs[9:0] | 10 | logic | O | Retirement Pointer |
| From OEL | | | | |
| oel_sbq_rdy_rs | 1 | logic | I | OEL rdy to accept output set |
| To OEL | | | | |
| sbq_oel_dist_ras[7:0][15:0] | 128 | logic | O | Distance (per Hash) |
| sbq_oel_eof_rs | 1 | logic | O | EOF (slice_final) |
| sbq_oel_len_ras[7:0][8:0] | 72 | logic | O | Length (per Hash) |
| sbq_oel_lqb_ras[7:0][7:0] | 64 | logic | O | Leading LAQ Byte (per Hash) |
| sbq_oel_vld_rs | 1 | logic | O | Valid output set |
| sbq_oel_vld_rxs[7:0] | 8 | logic | O | |

Figure 7:
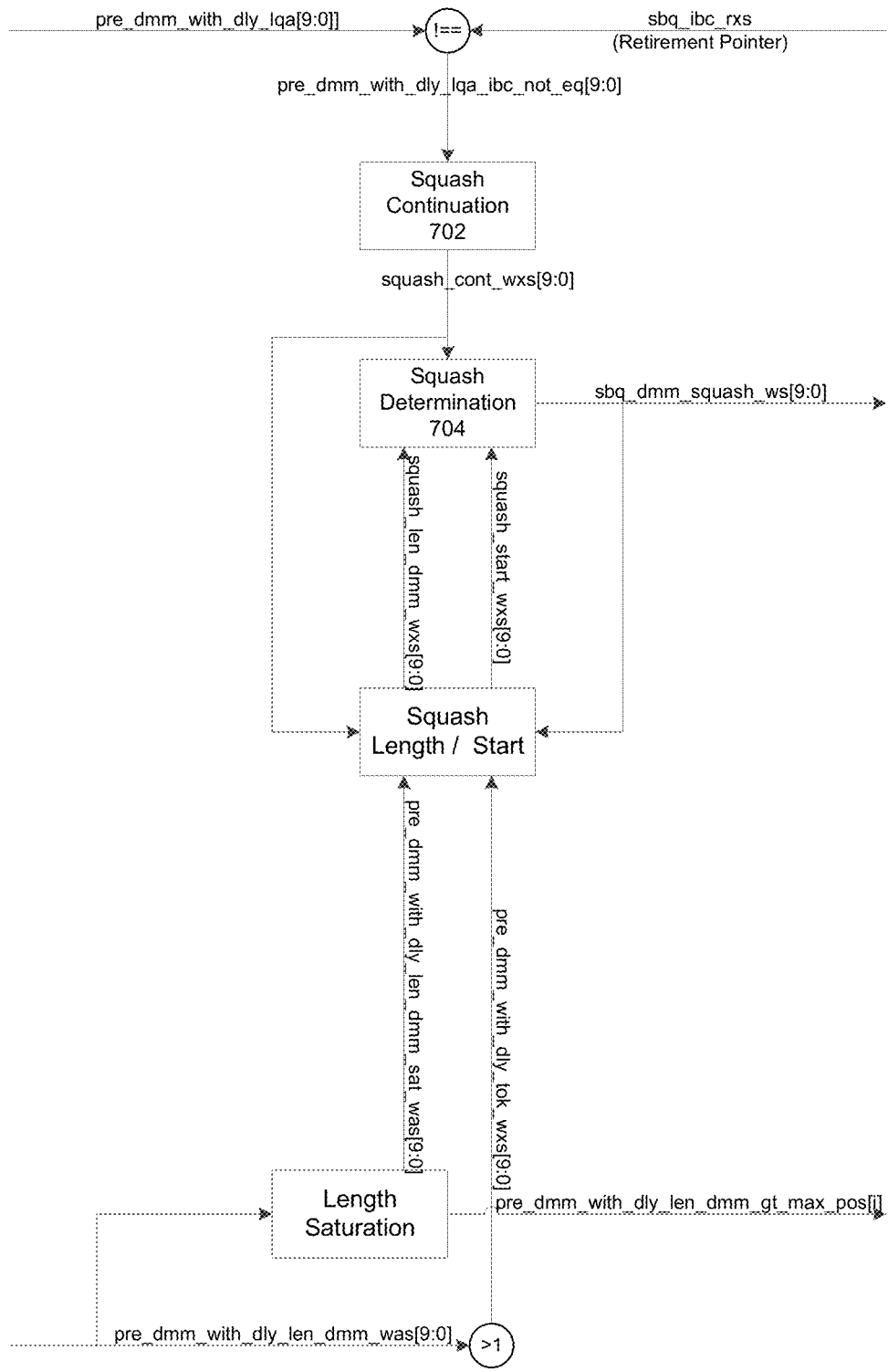
FIG. 7 depicts an example system in accordance with an embodiment.

FIG. 7 depicts an example system. The system can be used to determine which entry to squash. For example, a squash determination logic can use the system. A squash determination can be performed to generate a set of SBQ squash signals for a position i. Squashed positions are not be sent to the OEL. Position i is squashed if the LQA (input stream pointer) at position i does not match (i.e. has not reached) the running value of the retirement pointer at position i. The running value is incremented by 1 for an un-squashed literal (or token converted to a literal), or by L for an un-squashed token of length L. The last running value is used for the registered value of the Retirement Pointer as the starting value for the next cycle.

Squash continuation 702 can initialize a set of Squash Continuation signals to all 1's. An LQA (input stream pointer) at position i is compared with the registered value of the Retirement Pointer. The first matching position will reset Squash Continuation at that position and all subsequent values of i.

Squash determination 704 can determine whether to generate a squash signal for a position. For example, DMM Squash [0]=Squash Continuation [0]; DMM Squash [1]=Squash Continuation [1] or Squash Start [0]; DMM Squash [2]=Squash Continuation [2] or either of Squash Start [1:0] is asserted; and DMM Squash [i] for i>2=Squash Continuation [i] or either of Squash Start [i-1: i-2], or Squash Length DMM [i-3]>2.

A set of Token Detected signals is generated by detecting if the length at each position is greater than 1, since lengths less than the minimum match length have already been converted to length 1. These signals are used to determine Squash Start for the corresponding positions. If a position is already squashed, then it cannot be the start of a new squash.

A set of Squash Length signals is generated for use in the squash determination. If DMM Squash [i]==0, then Squash Length=DMM Saturated Length [i], which is the match length for position i capped to the maximum number of entries that could be squashed in this cycle. For example, if i=4, then the maximum value of DMM Saturated Length [4] is the max number of concatenated entries (e.g., 10) minus the position (4)=6. The length saturation status for each position is sent to the Output Logic to update the Retirement Pointer.

If DMM Squash [i]==1, then Squash Length [i] depends on whether the squash was generated in this cycle or a previous cycle. A state of (Squash Continuation[i]==1) indicates a quash was generated from a previous clock and governs the squashing, so Squash Length [i]=0. A state of (Squash Continuation[i]==0) indicates a squash was generated in the current clock from a prior position (if i>0), so the remaining Squash Length [i]=Squash Length [i−1]−1.

Figure 8A:
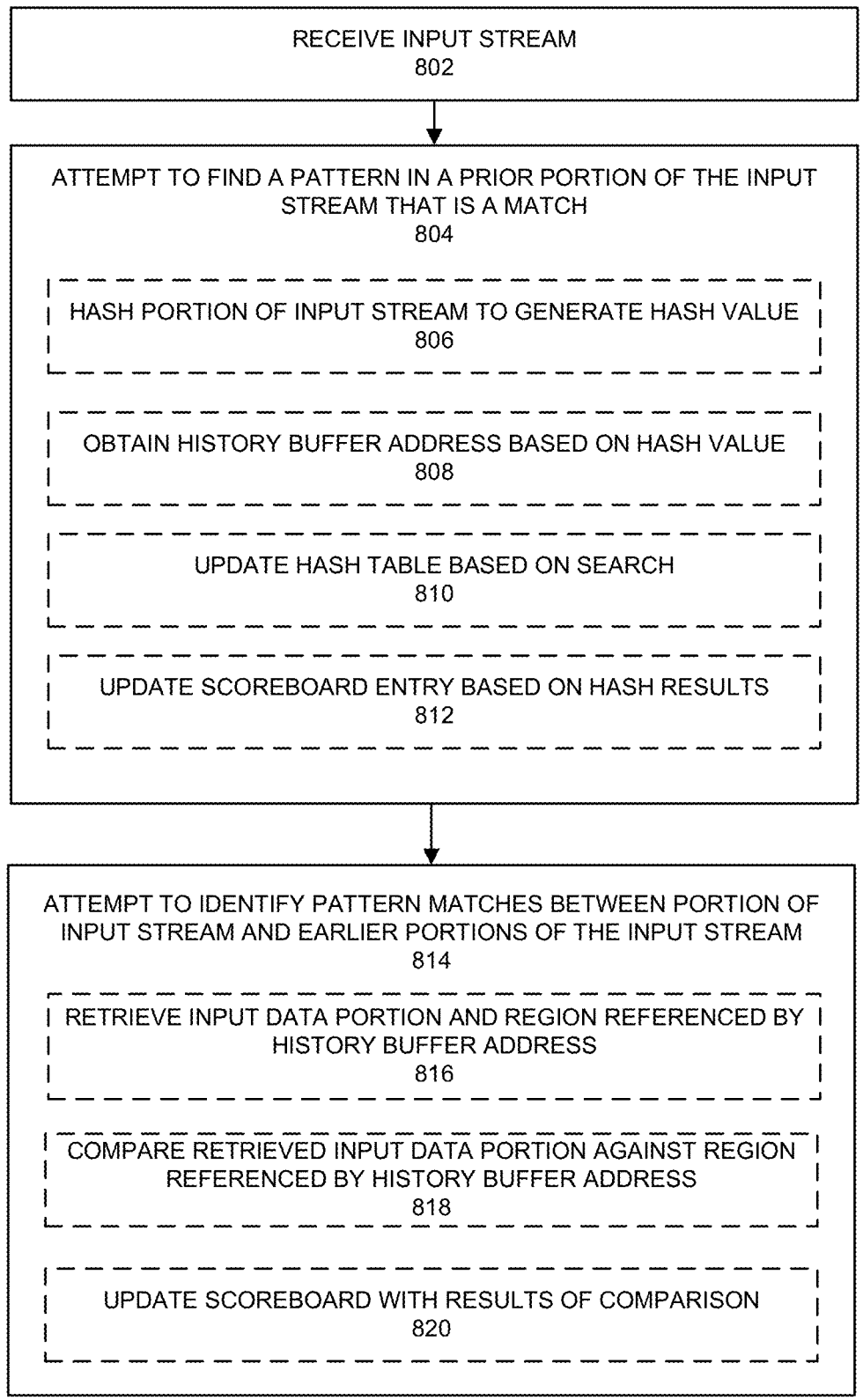
FIGS. 8A and 8B depicts an example process that can be performed in accordance with an embodiment.
Figure 8B:
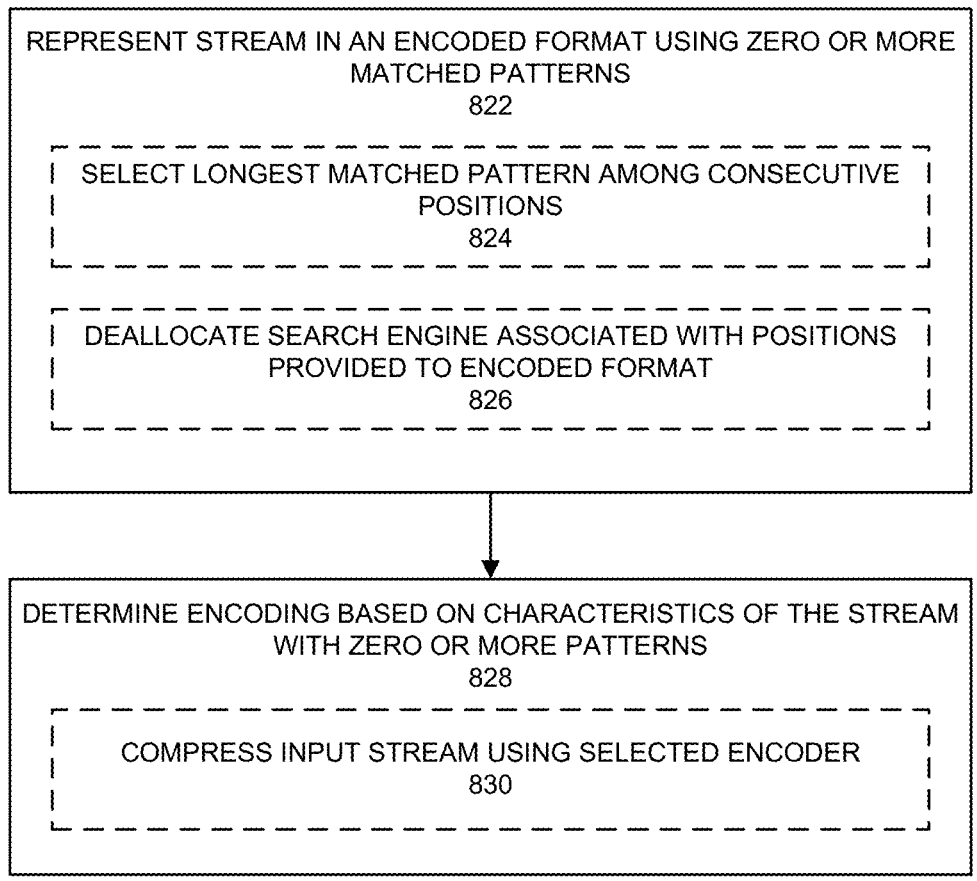

FIGS. 8A and 8B depict an example process that can be performed. The process can be performed by a CPU, network interface device or controller, offload engine, network interface products, hardware accelerator devices, or any device or software. Various embodiments can be used with lossless searching mechanisms for inline or lookaside data inputs for example in network interface controller or device or central processing unit implementations. Referring to FIG. 8A, at 802, an input stream can be received. An input stream can include a text file, media file, image, video, audio, or other content. The input stream can be of a certain size or length. The input stream can include plain text or clear text data and can be any format (e.g., ASCII, UTF-8, among others). At 804, a search can occur to attempt to find a pattern in a prior portion of the input stream that is a match. For example, action 804 can include one or more of actions 806, 808, 810, and 812. At 806, a hash of a segment of the input stream is made to generate a hash value. In some cases, 3 bytes or 4 bytes of the input stream can be hashed to generate a hash value. At 808, a history buffer address can be obtained based on the hash value. For example, a hash table that associates history buffer addresses with hash values. In some examples, multiple hash values can be generated in parallel and used to look-up multiple history buffer addresses. At 810, the hash table can be updated with the address of a leading byte hashed in 806. The oldest HBA can be evicted and the address of the leading byte (stream position) is written as the newest (and closest) HBA to-be. At 812, a scoreboard entry corresponding to the portion of the input stream that was used to generate a hash value can be updated with the determined history buffer addresses. If no HBA is found, there is an associated valid bit for each HBA from the Hash Unit that can be set to invalid.

At 814, an attempt is made to identify pattern matches between a portion of input stream and earlier portions of the input stream. For example, action 814 can include one or more of actions 816, 818, and 820. For example, at 816, one or more search units access a portion of an input stream and the region referenced by a history buffer address. At 818, a comparison is made between the portion of an input stream and the region referenced by a history buffer address. At 820, the scoreboard is updated with the results of the comparison. For example, if there is a match of any characters between the portion of an input stream and the region referenced by a history buffer address, then a match can be indicated in the scoreboard. If no match is found between any characters of the group position, a match length of zero can be provided. The comparison (by the SU) can result in any length from 0 (no match whatsoever) up to the maximum match length. Action 822 of FIG. 8B can follow action 820.

Referring to FIG. 8B, at 822, the input stream can be represented using zero or more patterns identified based on matched patterns. To select a result from multiple matches, at 824, a result with a longest character length match can be chosen. If lengths of character matches of several search results are the same, a result with the smallest offset (Dis) is selected. For example, the input stream can be converted into an LZ77 stream that includes literals and selected tokens (e.g., represented using character length (Len) and distance (Dis)), if any. At 826, one or more search engines associated with a stream position that has been provided for inclusion in the LZ77 stream can be deallocated and discontinue searching for any character(s). The one or more search engines can be permitted to power-down, enter lower power mode, or search for character(s) associated with another stream position.

At 828, an encoding scheme can be selected based on characteristics of the stream with zero or more patterns. An encoding scheme can be chosen based on one or more of the following: type and size of an input stream, a length of a pattern, a distance from a start of where the pattern is to be inserted to the beginning of where the pattern occurred previously, a gap between two pattern matches (including different or same patterns), standard deviation of a length of a pattern, standard deviation of a distance from a start of where the pattern is to be inserted to the beginning of where the pattern occurred previously, or standard deviation of a gap between two pattern matches. An encoding scheme can be one or more of, but not limited to, LZ4, LZS, Zstandard, DEFLATE, Huffman coding, and Snappy standards and derivatives. At 830, the input stream can be compressed using the selected encoder. The compressed input stream can be available for transmission or storage. Subsequently, the compressed input stream can be decompressed or decoded.

Figure 9:
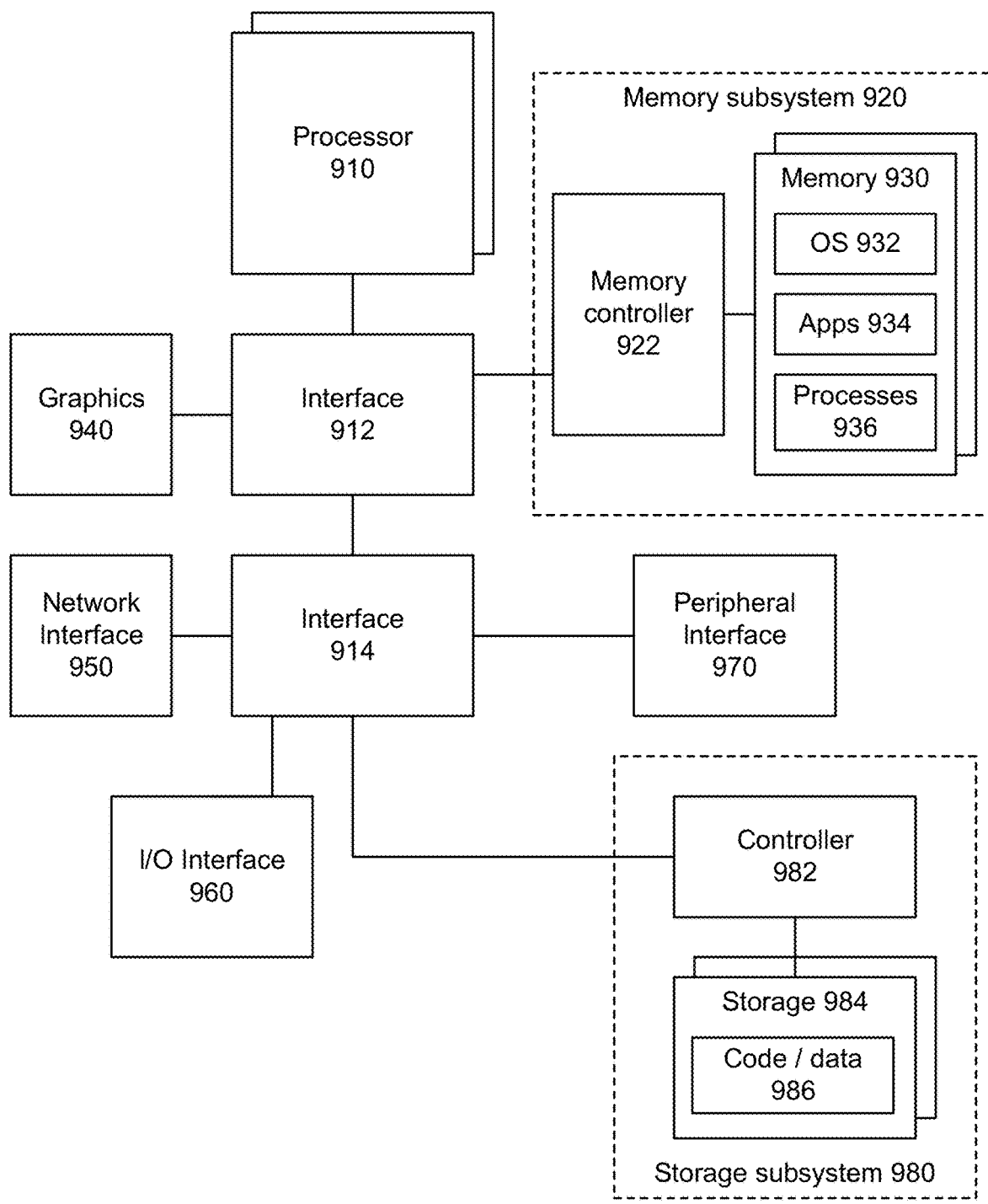
FIG. 9 depicts an example system in accordance with some embodiments in accordance with an embodiment.

FIG. 9 depicts a system. The system can use embodiments described herein. System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 900 includes interface 914, which can be coupled to interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can transmit data to a remote device, which can include sending data stored in memory. Network interface 950 can receive data from a remote device, which can include storing received data into memory. Various embodiments can be used in connection with network interface 950, processor 910, and memory subsystem 920.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 990 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910 or can include circuits or logic in both processor 910 and interface 914.

A power source (not depicted) provides power to the components of system 900. More specifically, power source typically interfaces to one or multiple power supplies in system 900 to provide power to the components of system 900. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 900 can be implemented using interconnected compute sleds of processors, memories, storages, network interfaces, and other components. High speed interconnects can be used such as PCIe, Ethernet, or optical interconnects (or a combination thereof).

Figure 10:
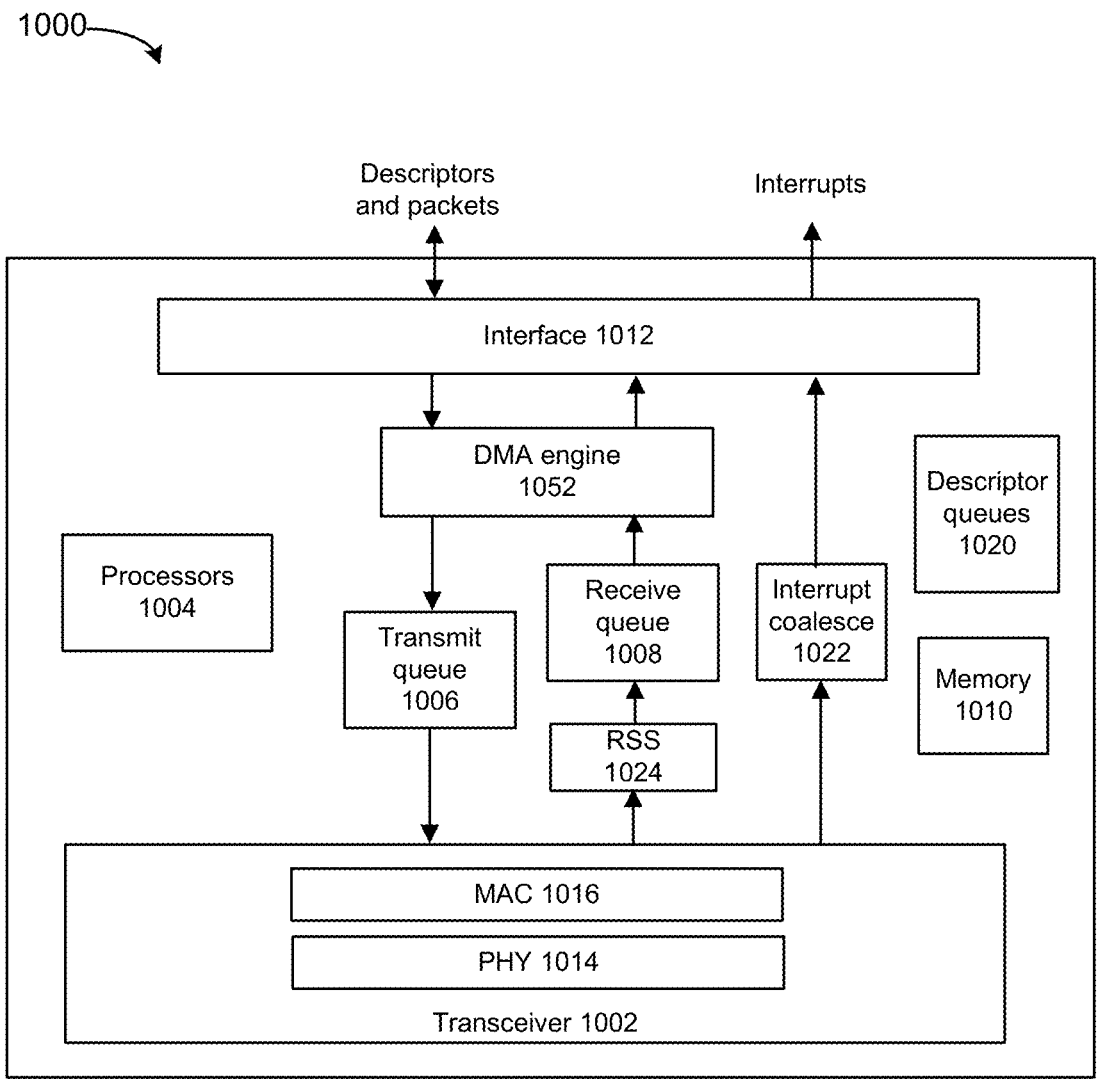
FIG. 10 depicts an example network interface in accordance with some embodiments in accordance with an embodiment.

FIG. 10 depicts a network interface. Various embodiments can use the network interface or be used by the network interface. Network interface 1000 can use transceiver 1002, processors 1004, transmit queue 1006, receive queue 10010, memory 1010, and bus interface 1012, and DMA engine 1052. Transceiver 1002 can be capable of receiving and transmitting packets in conformance with the applicable protocols such as Ethernet as described in IEEE 1002.3, although other protocols may be used. Transceiver 1002 can receive and transmit packets from and to a network via a network medium (not depicted). Transceiver 1002 can include PHY circuitry 1014 and media access control (MAC) circuitry 1016. PHY circuitry 1014 can include encoding and decoding circuitry (not shown) to encode and decode data packets according to applicable physical layer specifications or standards. MAC circuitry 1016 can be configured to assemble data to be transmitted into packets, that include destination and source addresses along with network control information and error detection hash values. Processors 1004 can be any a combination of a: processor, core, graphics processing unit (GPU), field programmable gate array (FPGA), application specific integrated circuit (ASIC), or other programmable hardware device that allow programming of network interface 1000. For example, processors 1004 can provide for identification of a resource to use to perform a workload and generation of a bitstream for execution on the selected resource. For example, a "smart network interface" can provide packet processing capabilities in the network interface using processors 1004.

Packet allocator 1024 can provide distribution of received packets for processing by multiple CPUs or cores using timeslot allocation described herein or RSS. When packet allocator 1024 uses RSS, packet allocator 1024 can calculate a hash or make another determination based on contents of a received packet to determine which CPU or core is to process a packet.

Interrupt coalesce 1022 can perform interrupt moderation whereby network interface interrupt coalesce 1022 waits for multiple packets to arrive, or for a time-out to expire, before generating an interrupt to host system to process received packet(s). Receive Segment Coalescing (RSC) can be performed by network interface 1000 whereby portions of incoming packets are combined into segments of a packet. Network interface 1000 provides this coalesced packet to an application.

Direct memory access (DMA) engine 1052 can copy a packet header, packet payload, and/or descriptor directly from host memory to the network interface or vice versa, instead of copying the packet to an intermediate buffer at the host and then using another copy operation from the intermediate buffer to the destination buffer.

Memory 1010 can be any type of volatile or non-volatile memory device and can store any queue or instructions used to program network interface 1000. Transmit queue 1006 can include data or references to data for transmission by network interface. Receive queue 10010 can include data or references to data that was received by network interface from a network. Descriptor queues 1020 can include descriptors that reference data or packets in transmit queue 1006 or receive queue 10010. Bus interface 1012 can provide an interface with host device (not depicted). For example, bus interface 1012 can be compatible with PCI, PCI Express, PCI-x, Serial ATA, and/or USB compatible interface (although other interconnection standards may be used).

Figure 11:
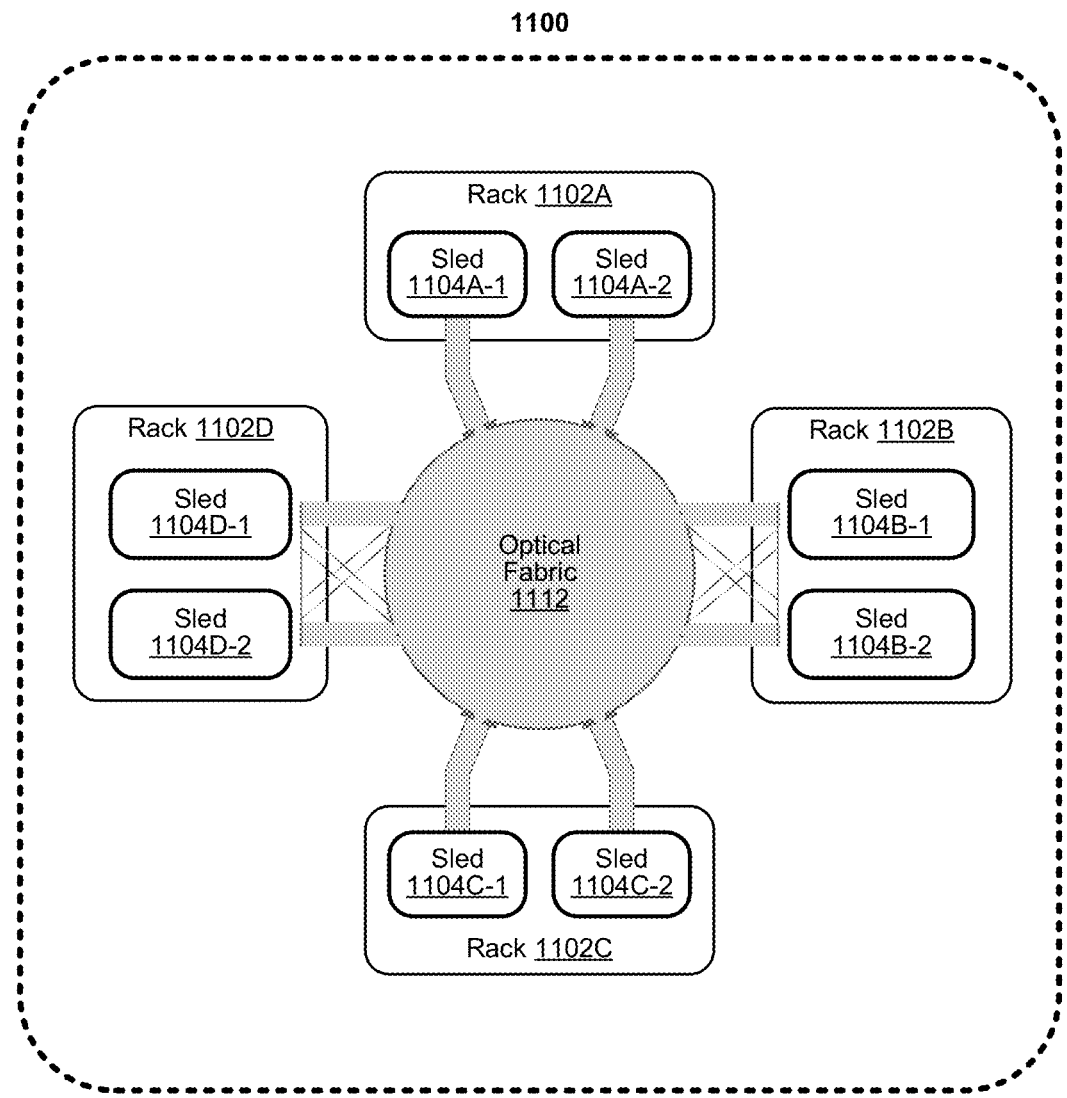
FIG. 11 depicts an example of a data center in accordance with some embodiments.

FIG. 11 depicts an example of a data center. Various embodiments can be used in or with the data center of FIG. 11. As shown in FIG. 11, data center 1100 may include an optical fabric 1112. Optical fabric 1112 may generally include a combination of optical signaling media (such as optical cabling) and optical switching infrastructure via which any particular sled in data center 1100 can send signals to (and receive signals from) the other sleds in data center 1100. The signaling connectivity that optical fabric 1112 provides to any given sled may include connectivity both to other sleds in a same rack and sleds in other racks. Data center 1100 includes four racks 1102A to 1102D and racks 1102A to 1102D house respective pairs of sleds 1104A-1 and 1104A-2, 1104B-1 and 1104B-2, 1104C-1 and 1104C-2, and 1104D-1 and 1104D-2. Thus, in this example, data center 1100 includes a total of eight sleds. Optical fabric 11012 can provide sled signaling connectivity with one or more of the seven other sleds. For example, via optical fabric 11012, sled 1104A-1 in rack 1102A may possess signaling connectivity with sled 1104A-2 in rack 1102A, as well as the six other sleds 1104B-1, 1104B-2, 1104C-1, 1104C-2, 1104D-1, and 1104D-2 that are distributed among the other racks 1102B, 1102C, and 1102D of data center 1100. The embodiments are not limited to this example. For example, fabric 1112 can provide optical and/or electrical signaling.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes an apparatus comprising: a memory and at least one processor, the at least one processor to: receive an input stream comprising first, second, and third portions; search the third portion of the input stream to find a first match with the first portion of the input stream; indicate a size of the first match between the third portion and the first portion; search the third portion of the input stream to find a second match with the second portion of the input stream; indicate a size of the second match between the third portion and the second portion; and select a longer of the first match and the second match as a candidate for inclusion in an encoded stream.

Example 2 includes the subject matter of Example 1, wherein the input stream comprises a fourth portion and the at least one processor is to: search the third portion of the input stream to find a third match with the fourth portion of the input stream; select the first match based on the first match being longer than the second match; and cause the search for the third match to stop based on the fourth portion including a portion of the first match.

Example 3 includes the subject matter of any of Examples 1-2, wherein the input stream comprises a fourth portion and the at least one processor is to: search the third portion of the input stream to find a third match with the fourth portion of the input stream; select the first match based on the first match being longer than the second match; and cause the third match to be not considered for inclusion in the encoded stream based on the fourth portion including a portion of the first match.

Example 4 includes the subject matter of any of Examples 1-3, wherein the first portion is associated with a first character and first position in the input stream; the second portion is associated with a second character and second position in the input stream; and the at least one processor is to: select the second match based on the second match being longer than the first match, provide the first character for inclusion in the encoded stream, and hold the second match for comparison with one or more other character string matches.

Example 5 includes the subject matter of any of Examples 1-4, wherein the input stream comprises a fourth portion; the first portion is associated with a first character and first position in the input stream; the second portion is associated with a second character and second position in the input stream; the fourth portion is associated with a third character and third position in the input stream; the at least one processor is to: search the third portion of the input stream to find a third match with the fourth portion of the input stream, select the third match based on the third match being a longest among the first match, the second match, and the third match, provide the first character for inclusion in the encoded stream, provide the second character for inclusion in the encoded stream, and hold the third match for comparison with one or more other character string matches.

Example 6 includes the subject matter of any of Examples 1-5, the input stream comprises a fourth portion; the first portion is associated with a first character and first position in the input stream; the second portion is associated with a second character and second position in the input stream; the fourth portion is associated with a third character and third position in the input stream; the at least one processor is to: search the third portion of the input stream to find a third match with the fourth portion of the input stream, select the third match based on a length of the third match being at least two longer than a length of the first match and longer than a length of the second match, provide the first character for inclusion in the encoded stream, provide the second character for inclusion in the encoded stream, and hold the third match for comparison with one or more other character string matches.

Example 7 includes the subject matter of any of Examples 1-6, wherein the encoded stream comprises an LZ77 compliant stream.

Example 8 includes the subject matter of any of Examples 1-7, wherein the at least one processor is to compress the encoded stream based on properties of the encoded stream.

Example 9 includes the subject matter of any of Examples 1-8 and comprises one or more of: a network interface, central processing unit, or an offload engine.

Example 10 includes a method comprising: searching for a first match in a data stream with a first portion of data; searching for a second match in the data stream with a second portion of data; identifying the first match in the data stream with the first portion, wherein the first portion comprises multiple characters; and causing searching for the second match in the data stream to search a portion of the data stream beginning after the first portion.

Example 11 includes the subject matter of Example 10 and comprises halting searching for the second match in the data stream with the second portion of data in response to identifying the first match in the data stream with the first portion.

Example 12 includes the subject matter of any of Examples 10-11 and comprises determining whether to include the first match in an encoded stream based on a length of the first match and a length of at least one other match.

Example 13 includes the subject matter of any of Examples 10-12, wherein the first match comprises multiple characters and the at least one other match comprises a literal and comprising: selecting the first match for inclusion in the encoded stream based on the first match being longer in length than the at least one other match.

Example 14 includes the subject matter of any of Examples 10-13, wherein the first match comprises multiple characters and the at least one other match comprises a third match and a fourth match and comprising: the third match is associated with a first character and first position in the data stream and the third match comprises multiple characters; the fourth match is associated with a second character and second position in the data stream and the fourth match comprises multiple characters; providing the first character for inclusion in the encoded stream; providing the second character for inclusion in the encoded stream; and holding the first match for comparison with a length of at least one other match.

Example 15 includes the subject matter of any of Examples 10-14 and comprises compressing the encoded stream using a compression scheme.

Example 16 includes the subject matter of any of Examples 10-15, wherein the compression scheme comprises one or more of: LZ4, LZ4s, iLZ77, LZS, Zstandard, DEFLATE, Huffman coding, or Snappy standards.

Example 17 includes a system comprising: a network interface; a memory; and at least one processor communicatively coupled to the network interface and the memory, the at least one processor to: receive a first match between a first character string and a portion of an input stream, receive a second match between a second character string and a second portion of the input stream, select a match from a longer of the first match and the second match, and compare the selected match with at least one other match to determine whether to include the selected match in an encoded stream.

Example 18 includes the subject matter of Example 17, wherein the second match is selected based on being longer than the first match, the first match is associated with a first character and first position in the input stream, and the at least one processor is to provide the first character for inclusion in the encoded stream.

Example 19 includes the subject matter of any of Examples 17-18, wherein the at least one processor is to discontinue search for a character string that overlaps with the selected match.

Example 20 includes the subject matter of any of Examples 17-19, wherein the network interface is to compress the encoded stream.

APPENDIX 1

Static DEFLATE Encoding

A static deflate block is made up of a 3-bit header, followed by the compressed data. For static deflate the LZ77 stream is encoded using a look-up table. Symbols in the LZ77 stream are substituted with a corresponding static code from the look-up table. A stored block is simply a copy of an uncompressed data block, for example, a block of literals.

Static Huffman Coding

Static DEFLATE is encoded using two distinct fixed code alphabets: Literal/Length and Distance. Literal and Length symbols are combined and represented using a single alphabet (0-287), and Distance symbols are represented using a different alphabet (0-31). From the Literal/Length alphabet, Symbols (0-255) represent Literals (0-255), symbol 256 represents End-Of-Block, and Symbols (257-285) with extra bits represent Lengths (3-258). From the Distance alphabet, symbols (0-29) with extra bits represent distances (1-32768). As an example, Literal 144 would be encoded using a 9-bit code as "110010000". To encode Length 100, the base Length symbol is drawn as symbol 279 and requires 4 extra bits. The 4extras bits would be encoded as "0001". And now symbol 279 would be encoded using code "0010111". Now combining the base code and the extra bits, Length 100 would be encoded as "0010111" "0001".

| Static Literal/Length Alphabet | | |
|---|---|---|
| Literal/length Codes | Number of Bits Used | Literal/Length |
| 0011000-10111111 | 8 | 0-143 |
| 110010000-111111111 | 9 | 144-255 |
| 0000000-0010111 | 7 | 256-279 |
| 11000000-11000111 | 8 | 280-287 |

| Static Length Code Alphabet and Extra Bits | | | | | | | | |
|---|---|---|---|---|---|---|---|---|
| Length Code | Extra Bits Used | Length | Length Code | Extra Bits Used | Length | Length Code | Extra Bits Used | Length |
| 257 | 0 | 3 | 267 | 1 | 15, 16 | 277 | 4 | 67-82 |
| 258 | 0 | 4 | 268 | 1 | 17, 18 | 278 | 4 | 83-98 |
| 259 | 0 | 5 | 269 | 2 | 19-22 | 279 | 4 | 99-114 |
| 260 | 0 | 6 | 270 | 2 | 23-26 | 280 | 4 | 115-130 |
| 261 | 0 | 7 | 271 | 2 | 27-30 | 281 | 5 | 131-162 |
| 262 | 0 | 8 | 272 | 2 | 31-34 | 282 | 5 | 163-194 |

-continued

Static Length Code Alphabet and Extra Bits

| Length Code | Extra Bits Used | Length | Length Code | Extra Bits Used | Length | Length Code | Extra Bits Used | Length |
|---|---|---|---|---|---|---|---|---|
| 263 | 0 | 9 | 273 | 3 | 35-42 | 283 | 5 | 195-226 |
| 264 | 0 | 10 | 274 | 3 | 43-50 | 284 | 5 | 227-257 |
| 265 | 1 | 11, 12 | 275 | 3 | 51-58 | 285 | 0 | 258 |
| 266 | 1 | 13, 14 | 276 | 3 | 59-66 | | | |

Static Distance Code Alphabet and Extra Bits

| Distance Code | Extra Bits Used | Distance | Distance Code | Extra Bits Used | Distance | Distance Code | Extra Bits Used | Distance |
|---|---|---|---|---|---|---|---|---|
| 0 | 0 | 1 | 10 | 4 | 33-48 | 20 | 9 | 1025-1536 |
| 1 | 0 | 2 | 11 | 4 | 49-64 | 21 | 9 | 1537-2048 |
| 2 | 0 | 3 | 12 | 5 | 65-96 | 22 | 10 | 2049-3072 |
| 3 | 0 | 4 | 13 | 5 | 97-128 | 23 | 10 | 3073-4096 |
| 4 | 1 | 5, 6 | 14 | 6 | 129-192 | 24 | 11 | 4097-6144 |
| 5 | 1 | 7, 8 | 15 | 6 | 193-256 | 25 | 11 | 6145-8192 |
| 6 | 2 | 9-12 | 16 | 7 | 257-384 | 26 | 12 | 8193-12288 |
| 7 | 2 | 13-16 | 17 | 7 | 385-512 | 27 | 12 | 12289-16384 |
| 8 | 3 | 17-24 | 18 | 8 | 513-768 | 28 | 13 | 16385-24576 |
| 9 | 3 | 25-32 | 19 | 8 | 769-1024 | 29 | 13 | 24577-32768 |

LZ4 Encoding

The expectation is that LZ4 will be supported using the LZ4 Streaming Format and not as a single compressed block. The LZ4 Streaming Format dictates that the clear text per input block cannot exceed the LBMS programmable size of: 64KB, 256KB, 1MB, or 4MB. The LZ4Streaming Format can also contain uncompressed LZ4 blocks in the stream.

The OEL support a 1KB literal buffer. An LZ4 sequence can only be encoded when a match occurs as both the match and the literal string info are needed in order to encode the LZ4sequence header, which is at the head of the LZ4 sequence. During the encoding process when the OEL encounters a literal from the DMM Logic, the OEL will insert the literal into the literal buffer. Consecutive literals will be buffered until a match or the literal buffer fills up. If the literal buffer fills up, the LZ4 sequence will be encoded as the last sequence of the LZ4 block and an End of LZ4 Block exception will be raised. If a match is encountered prior to the literal buffer filling up, the LZ4 sequence is encoded with literals and a match. Assuming the literal buffer never fills up, the LZ4 encoding process will continue until either the output buffer overflows or the input data is exhausted. During the encoding process, if the DMM Logic drives back to back match, the LZ4 sequence for the following match will be encoded with only a match - no literals. The last LZ4 sequence of the LZ4 block must be encoded with only literals.

What is claimed is:

1. An apparatus comprising:
a memory and
at least one processor, the at least one processor to:
receive an input stream comprising first, second, and third portions;
search the third portion of the input stream to find a first match with the first portion of the input stream;
indicate a size of the first match between the third portion and the first portion;
search the third portion of the input stream to find a second match with the second portion of the input stream;
indicate a size of the second match between the third portion and the second portion; and
select a longer of the first match and the second match as a candidate for inclusion in an encoded stream.

2. The apparatus of claim 1, wherein the input stream comprises a fourth portion and the at least one processor is to:
search the third portion of the input stream to attempt to find a third match with the fourth portion of the input stream;
select the first match based on the first match being longer than the second match; and
cause the attempt to find the third match to stop based on the fourth portion including a portion of the first match.

3. The apparatus of claim 1, wherein the input stream comprises a fourth portion and the at least one processor is to:
search the third portion of the input stream to find a third match with the fourth portion of the input stream;
select the first match based on the first match being longer than the second match; and
cause the third match to be not considered for inclusion in the encoded stream based on the fourth portion including a portion of the first match.

4. The apparatus of claim 1, wherein:
the first portion is associated with a first character and first position in the input stream;
the second portion is associated with a second character and second position in the input stream; and
the at least one processor is to:
select the second match based on the second match being longer than the first match,
provide the first character for inclusion in the encoded stream, and
hold the second match for comparison with one or more other character string matches.

5. The apparatus of claim 1, wherein:
the input stream comprises a fourth portion;
the first portion is associated with a first character and first position in the input stream;
the second portion is associated with a second character and second position in the input stream;
the fourth portion is associated with a third character and third position in the input stream; and
the at least one processor is to:
search the third portion of the input stream to find a third match with the fourth portion of the input stream;
select the third match based on the third match being a longest among the first match, the second match, and the third match;
provide the first character for inclusion in the encoded stream;

provide the second character for inclusion in the encoded stream; and hold the third match for comparison with one or more other character string matches.

6. The apparatus of claim 1, wherein:

the input stream comprises a fourth portion;

the first portion is associated with a first character and first position in the input stream;

the second portion is associated with a second character and second position in the input stream;

the fourth portion is associated with a third character and third position in the input stream;

the at least one processor is to:

search the third portion of the input stream to find a third match with the fourth portion of the input stream;

select the third match based on a length of the third match being at least two longer than a length of the first match and longer than a length of the second match;

provide the first character for inclusion in the encoded stream;

provide the second character for inclusion in the encoded stream; and hold the third match for comparison with one or more other character string matches.

7. The apparatus of claim 1, wherein the encoded stream comprises an LZ77 compliant stream.

8. The apparatus of claim 1, wherein the at least one processor is to:

compress the encoded stream based on properties of the encoded stream.

9. The apparatus of claim 1, comprising one or more of: a network interface, central processing unit, or an offload engine.

10. A method comprising:

searching for a first match in a data stream with a first portion of data;

searching for a second match in the data stream with a second portion of data;

identifying the first match in the data stream with the first portion, wherein the first portion comprises multiple characters; and causing searching for the second match in the data stream to search a portion of the data stream beginning after the first portion.

11. The method of claim 10, comprising halting searching for the second match in the data stream with the second portion of data in response to identifying the first match in the data stream with the first portion.

12. The method of claim 10, comprising:

determining whether to include the first match in an encoded stream based on a length of the first match and a length of at least one other match.

13. The method of claim 12, wherein the first match comprises multiple characters and the at least one other match comprises a literal and comprising:

selecting the first match for inclusion in the encoded stream based on the first match being longer in length than the at least one other match.

14. The method of claim 12, wherein the first match comprises multiple characters and the at least one other match comprises a third match and a fourth match and comprising:

the third match is associated with a first character and first position in the data stream and the third match comprises multiple characters;

the fourth match is associated with a second character and second position in the data stream and the fourth match comprises multiple characters;

providing the first character for inclusion in the encoded stream;

providing the second character for inclusion in the encoded stream; and holding the first match for comparison with at least one other match.

15. The method of claim 10, comprising generating an encoded stream based on the first match and a compression scheme.

16. The method of claim 15, wherein the compression scheme comprises one or more of: LZ4, LZ4s, iLZ77, LZS, Zstandard, DEFLATE, Huffman coding, Snappy standards, or no compression.

17. A system comprising:

a network interface;

a memory; and at least one processor communicatively coupled to the network interface and the memory, the at least one processor to:

receive a first match between a first character string and a portion of an input stream, receive a second match between a second character string and a second portion of the input stream, select a match from a longer of the first match and the second match, and compare the selected match with at least one other match to determine whether to include the selected match in an encoded stream.

18. The system of claim 17, wherein:

the second match is selected based on being longer than the first match, the first match is associated with at least one character and a first position in the input stream, and the at least one processor is to provide the at least one character for inclusion in the encoded stream.

19. The system of claim 17, wherein the at least one processor is to discontinue search for a character string that overlaps with the selected match.

20. The system of 17, wherein the network interface is to compress the encoded stream.

21. An apparatus comprising:

a memory and a set of multiple search units comprising a first search unit and a second search unit and coupled to the memory, wherein:

the multiple search units are to attempt to find a token comprising a character string match with a portion of an input stream and the second search unit is to halt its search for a second character string match based on the first search unit finding the token and the second character string match overlapping with the token.

22. The apparatus of claim 21, wherein the second search unit to halt its search comprises reduction of power to the second search unit.

23. The apparatus of claim 21, wherein the second search unit to halt its search comprises the second search unit to search for a third character string starting after the token.

* * * * *